US010797084B2

(12) United States Patent
Lee et al.

(10) Patent No.: US 10,797,084 B2
(45) Date of Patent: *Oct. 6, 2020

(54) DISPLAY APPARATUS

(71) Applicant: SAMSUNG DISPLAY CO., LTD., Yongin-si, Gyeonggi-do (KR)

(72) Inventors: Wonse Lee, Yongin-si (KR); Yunkyeong In, Yongin-si (KR); Kwangmin Kim, Yongin-si (KR); Joongsoo Moon, Yongin-si (KR); Ae Shin, Yongin-si (KR); Jieun Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/211,479

(22) Filed: Dec. 6, 2018

(65) Prior Publication Data

US 2019/0109156 A1 Apr. 11, 2019

Related U.S. Application Data

(63) Continuation of application No. 15/880,089, filed on Jan. 25, 2018, now Pat. No. 10,163,941.

(30) Foreign Application Priority Data

Jun. 16, 2017 (KR) .................. 10-2017-0076813

(51) Int. Cl.
*H01L 27/12* (2006.01)
*H01L 27/32* (2006.01)

(52) U.S. Cl.
CPC ........ *H01L 27/124* (2013.01); *H01L 27/1218* (2013.01); *H01L 27/1259* (2013.01);
(Continued)

(58) Field of Classification Search
CPC .............. H01L 27/124; H01L 27/1218; H01L 27/1259; H01L 27/3276; H01L 27/3246;
(Continued)

(56) References Cited

U.S. PATENT DOCUMENTS 9,287,329 B1 3/2016 Lee et al.
10,163,941 B1 * 12/2018 Lee .................... H01L 27/124
(Continued)

FOREIGN PATENT DOCUMENTS

EP 2 733 528 8/2014
KR 1020080064531 7/2008
(Continued)

OTHER PUBLICATIONS

Corresponding to U.S. Appl. No. 15/880,089, filed Jan. 25, 2018 (not yet published).
(Continued)

*Primary Examiner* — Cuong Q Nguyen
(74) *Attorney, Agent, or Firm* — F. Chau & Associates, LLC

(57) ABSTRACT

A display apparatus is provided that includes a substrate having a display area and a peripheral area located outside the display area. A first part of an edge of the display area has a round shape and the peripheral area includes a pad area. The display apparatus further includes a first wiring extending in a direction toward the first part from the pad area, and having a first discontinuous point at which the first wiring is physically discontinuous; and a first bridge wiring allowing the first wiring to be electrically continuous at the first discontinuous point.

28 Claims, 20 Drawing Sheets

(52) U.S. Cl.
CPC ...... *H01L 27/3276* (2013.01); *H01L 27/3246* (2013.01); *H01L 27/3258* (2013.01); *H01L 27/3262* (2013.01); *H01L 2227/323* (2013.01)

(58) Field of Classification Search
CPC ............. H01L 27/3258; H01L 27/3262; H01L 2227/323
See application file for complete search history.

(56) References Cited

U.S. PATENT DOCUMENTS

| | | |
|---|---|---|
| 2005/0062046 A1 | 3/2005 | Kim et al. |
| 2008/0165110 A1 | 7/2008 | Kim et al. |
| 2014/0217397 A1 | 8/2014 | Kwak et al. |
| 2015/0109544 A1 | 4/2015 | Yeo et al. |
| 2015/0187803 A1 | 7/2015 | Moh et al. |
| 2016/0299599 A1 | 10/2016 | Kang et al. |

FOREIGN PATENT DOCUMENTS

| | | |
|---|---|---|
| KR | 1020120020298 | 3/2012 |
| KR | 1020150025774 | 3/2015 |

OTHER PUBLICATIONS

Extended European Search Report issued by the EPO dated Aug. 30, 2018 corresponding to European Patent Application No. 18154366.1.

\* cited by examiner

DISPLAY APPARATUS

CROSS-REFERENCE TO RELATED APPLICATION

This U.S. application is a continuation application of U.S. patent application Ser. No. 15/880,089, filed Jan. 25, 2018, which claims the benefit of priority under 35 U.S.C. § 119 to Korean Patent Application No. 10-2017-0076813, filed on Jun. 16, 2017, in the Korean Intellectual Property Office, the disclosures of which are incorporated by reference in their entireties herein.

BACKGROUND

1. Technical Field

The present disclosure relates to a display apparatus, and more particularly, to a display apparatus which may reduce generation of defects in pixels at an edge of a display area during a manufacturing process.

2. Discussion of Related Art

A display apparatus has a display area including several pixels. When some of the pixels located in the display area are defective, quality of an image produced by the display apparatus may deteriorate. Accordingly, it is necessary to prevent generation of defective pixels during a manufacturing process or to reduce an incidence rate of defective pixels.

However, it can be difficult to prevent defective pixels from being formed at an edge of a display area during the manufacturing process.

SUMMARY

At least one embodiment of the inventive concept includes a display apparatus which may reduce generation of defective pixels in an edge of a display area during a manufacturing process.

According to an exemplary embodiment of the inventive concept, a display apparatus includes a substrate having a display area and a peripheral area disposed outside the display area. A first part of an edge of the display area has a curved shape and the peripheral area includes a pad area. The display apparatus further includes a first wiring extending in a direction toward the first part such that a first one end of the first wiring is located in the pad area and a first other end of the first wiring is located in the peripheral area, a first additional wiring extending in a direction toward the display area such that a first additional one end of the first additional wiring is electrically connected to the first other end of the first wiring and a first additional other end of the first additional wiring is located in the peripheral area, and a first signal line extending in a direction toward an inside of the display area and having one end electrically connected to the first additional other end.

The display apparatus may further include a first bridge wiring connecting the first other end of the first wiring to the first additional one end of the first additional wiring.

The first wiring and the first additional wiring may include the same material, and the first bridge wiring may include the same material as the first signal line and may be arranged on the same layer as the first signal line.

The first wiring and the first additional wiring may be arranged on the same layer.

The display apparatus may further include a first additional bridge wiring located over the first bridge wiring and having both ends connected to the first bridge wiring.

The display apparatus may further include a thin film transistor located in the display area and comprising a gate electrode, a source electrode, and a drain electrode, the source and drain electrodes being located on an interlayer insulating film covering the gate electrode, wherein the first wiring and the first additional wiring include the same material as the gate electrode and are arranged on the same layer as the gate electrode, and the first signal line may include the same material as the source electrode and the drain electrode and may be arranged on the same layer as the source electrode and the drain electrode.

The display apparatus may further include a first bridge wiring connecting the first other end of the first wiring and the first additional one end of the first additional wiring, including the same material as the first signal line, and arranged on the same layer as the first signal line.

The display apparatus may further include a pixel electrode electrically connected to one of the source electrode and the drain electrode, and a first additional bridge wiring having both ends connected to the first bridge wiring, comprising the same material as the pixel electrode, and arranged on the same layer as the pixel electrode.

The display apparatus may further include a pixel electrode electrically connected to one of the source electrode and the drain electrode, and a first additional bridge wiring connecting the first other end of the first wiring and the first additional one end of the first additional wiring, including the same material as the pixel electrode, and arranged on the same layer as the pixel electrode.

The first other end of the first wiring may be closer to the display area than the first additional one end of the first additional wiring.

The display area may include a first edge and a second edge facing each other, and a third edge and a fourth edge facing each other and being arranged between the first edge and the second edge, the first part connecting the first edge and the fourth edge, and the pad area may be close to the fourth edge among the first edge to the fourth edge.

The display apparatus may further include a second wiring extending in a direction toward the first part such that a second one end of the second wiring is located in the pad area and a second other end of the second wiring is located in the peripheral area, and arranged closer to the first edge than the first wiring, a second additional wiring extending in a direction toward the display area such that a second additional one end of the second additional wiring is electrically connected to the second other end of the second wiring and a second additional other end of the second additional wiring is located in the peripheral area, and arranged closer to the first edge than the first additional wiring, and a second signal line having one end electrically connected to the second additional other end and extending in a direction toward the inside of the display area.

A shortest distance from an imaginary straight line including the fourth edge to a second position at which the second other end of the second wiring and the second additional one end of the second additional wiring are connected to each other may be greater than a shortest distance from the imaginary straight line to at a first position where the first other end of the first wiring and the first additional one end of the first additional wiring are connected to each other.

The display apparatus may further include a first bridge wiring connecting the first other end of the first wiring and the first additional one end of the first additional wiring, and a second bridge wiring connecting the second other end of the second wiring and the second additional one end of the second additional wiring.

The display apparatus may further include a first thin film transistor located in the display area and comprising a first gate electrode, a first source electrode, and a first drain electrode, and a second thin film transistor located in the display area and comprising a second gate electrode, a second source electrode, and a second drain electrode, wherein the first gate electrode and the second gate electrode are located on different layers, and the first source electrode, the first drain electrode, the second source electrode, and the second drain electrode are located on an interlayer insulating film covering the first gate electrode and the second gate electrode, and wherein the first wiring and the first additional wiring comprise the same material as the first gate electrode and are arranged on the same layer as the first gate electrode, and the second wiring and the second additional wiring comprise the same material as the second gate electrode and are arranged on the same layer as the second gate electrode.

The display apparatus may further include a first thin film transistor located in the display area and comprising a first gate electrode, a first source electrode, and a first drain electrode, and a second thin film transistor located in the display area and comprising a second gate electrode, a second source electrode, and a second drain electrode, wherein the first gate electrode and the second gate electrode are located on different layers, and the first source electrode, the first drain electrode, the second source electrode, and the second drain electrode are located on an interlayer insulating film covering the first gate electrode and the second gate electrode, and wherein the first wiring and the second additional wiring comprise the same material as the first gate electrode and are arranged on the same layer as the first gate electrode, and the second wiring and the first additional wiring comprise the same material as the second gate electrode and are arranged on the same layer as the second gate electrode.

The display apparatus may further include a first thin film transistor located in the display area and comprising a first gate electrode, a first source electrode, and a first drain electrode, and a second thin film transistor located in the display area and comprising a second gate electrode, a second source electrode, and a second drain electrode, wherein the first source electrode and the first drain electrode are located on a different layer from the second source electrode and the second drain electrode, and wherein the first signal line and the first bridge wiring comprise the same material as the first source electrode and the first drain electrode, and are arranged on the same layer as the first source electrode and the first drain electrode, and the second signal line and the second bridge wiring comprise the same material as the second source electrode and the second drain electrode, and are arranged on the same layer as the second source electrode and the second drain electrode.

The display apparatus may further include a first thin film transistor located in the display area and comprising a first gate electrode, a first source electrode, and a first drain electrode, a second thin film transistor located in the display area and comprising a second gate electrode, a second source electrode, and a second drain electrode, a first additional bridge wiring located over the first bridge wiring and having both ends connected to the first bridge wiring, and a second additional bridge wiring located over the second bridge wiring and having both ends connected to the second bridge wiring, wherein the first source electrode and the first drain electrode are located on a different layer from the second source electrode and the second drain electrode, the first bridge wiring and the second bridge wiring comprise the same material as the first source electrode and the first drain electrode, and are arranged on the same layer as the first source electrode and the first drain electrode, and the first additional bridge wiring and the second additional bridge wiring comprise the same material as the second source electrode and the second drain electrode, and are arranged on the same layer as the second source electrode and the second drain electrode.

According to an exemplary embodiment of the inventive concept, a display apparatus includes a substrate having a display area and a peripheral area located outside the display area. A first part of an edge of the display area has a curved shape and the peripheral area includes a pad area. The display apparatus further includes a first wiring extending in a direction toward the first part from the pad area, and having a first discontinuous point at which the first wiring is physically discontinuous, and a first bridge wiring allowing the first wiring to be electrically continuous at the first discontinuous point.

The display apparatus may further include a second wiring extending in a direction toward the first part from the pad area and having a second discontinuous point at which the second wiring is physically discontinuous, and a second bridge wiring allowing the second wiring to be electrically continuous at the second discontinuous point, wherein the second bridge wiring is located farther from the pad area than the first bridge wiring, and the second bridge wiring is closer to an edge of the substrate than the first bridge wiring.

According to an exemplary embodiment of the inventive concept, a display apparatus includes a substrate having a display area and a peripheral area disposed outside the display area. A first part of an edge of the display area has a curved shape and the peripheral area includes a pad area. The display apparatus further includes a first wiring extending in a direction toward the first part such that a first one end of the first wiring is located in the pad area and a first other end of the first wiring is located in the peripheral area, a first additional wiring extending in a direction toward the display area such that a first additional one end of the first additional wiring is electrically connected to the first other end of the first wiring and a first additional other end of the first additional wiring is located in the peripheral area, and first bridge wiring connecting the first other end of the first wiring to the first additional one end of the first additional wiring.

The display apparatus may further include a first signal line extending in a direction toward an inside of the display area and having one end electrically connected to the first additional other end.

In an embodiment, the first bridge wiring is arranged on a same layer as the first signal line, and the first wiring and the first additional wiring are arranged on a same layer.

BRIEF DESCRIPTION OF THE DRAWINGS

The inventive concept will become apparent and more readily appreciated from the following description of the embodiments, taken in conjunction with the accompanying drawings in which.

DETAILED DESCRIPTION

Figure 1:
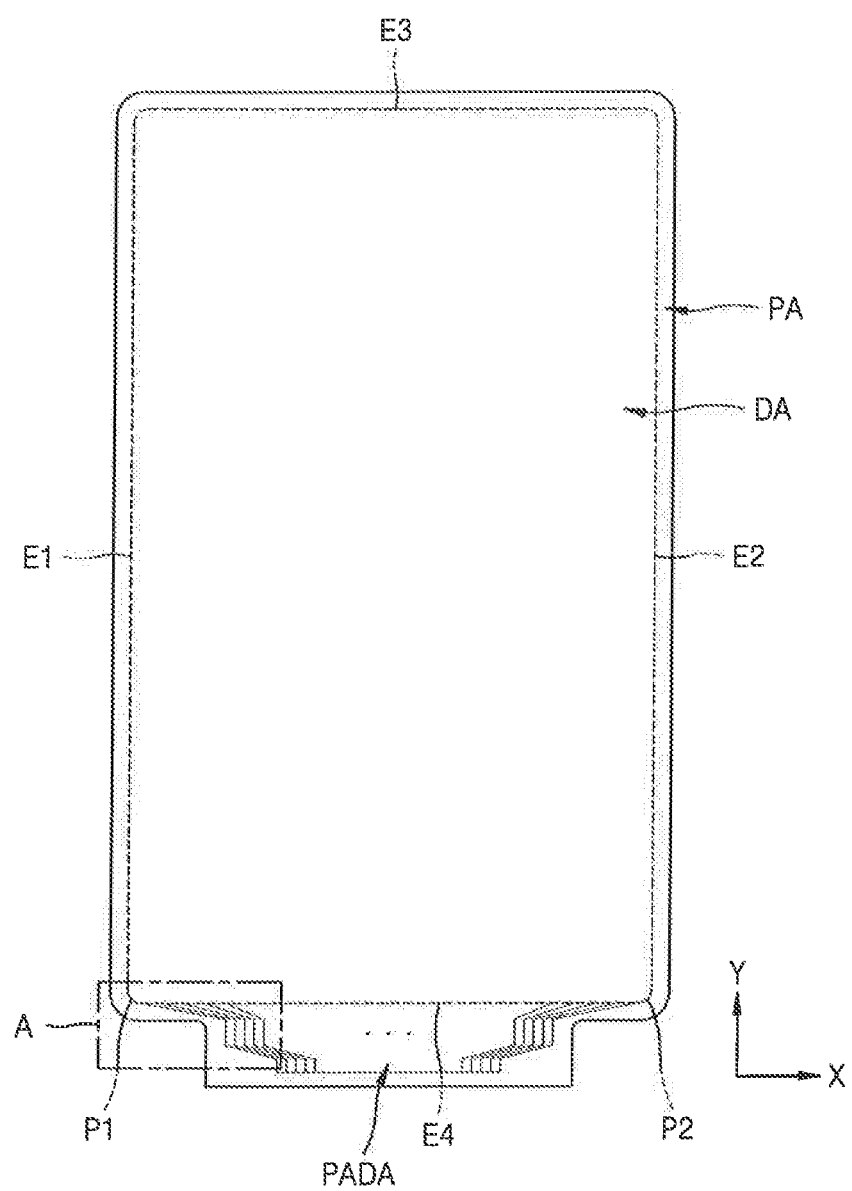
FIG. 1 is a conceptual view schematically illustrating one aspect of a manufacturing process of a display apparatus, according to an embodiment.

As the disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Like reference numerals in the drawings denote like elements.

It will be understood that when a component, such as a layer, a film, a region, or a plate, is referred to as being "on" another component, the component can be directly on the other component or intervening components may be present thereon.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
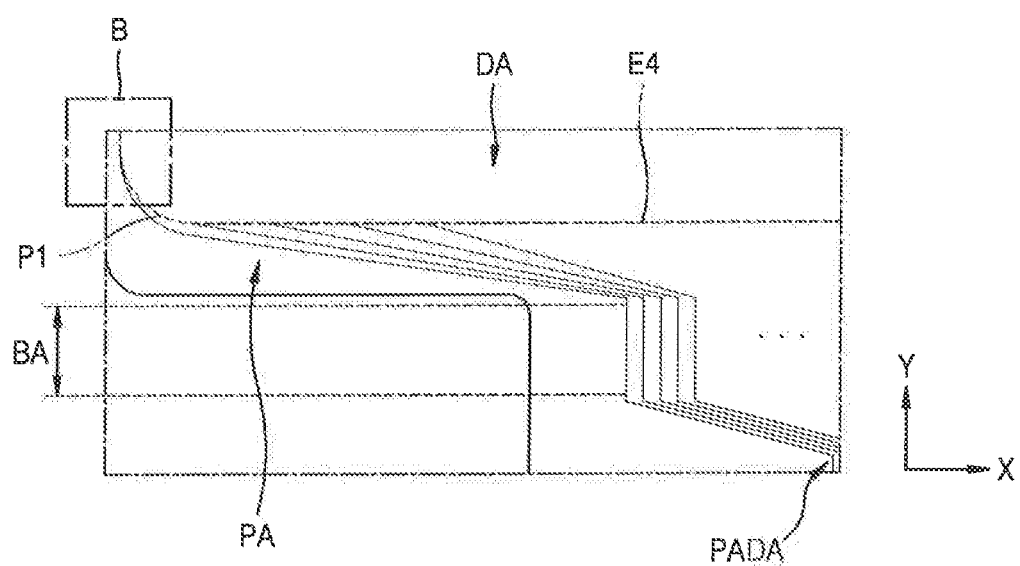
FIG. 2 is a conceptual view schematically illustrating a portion A of FIG. 1.
Figure 3:
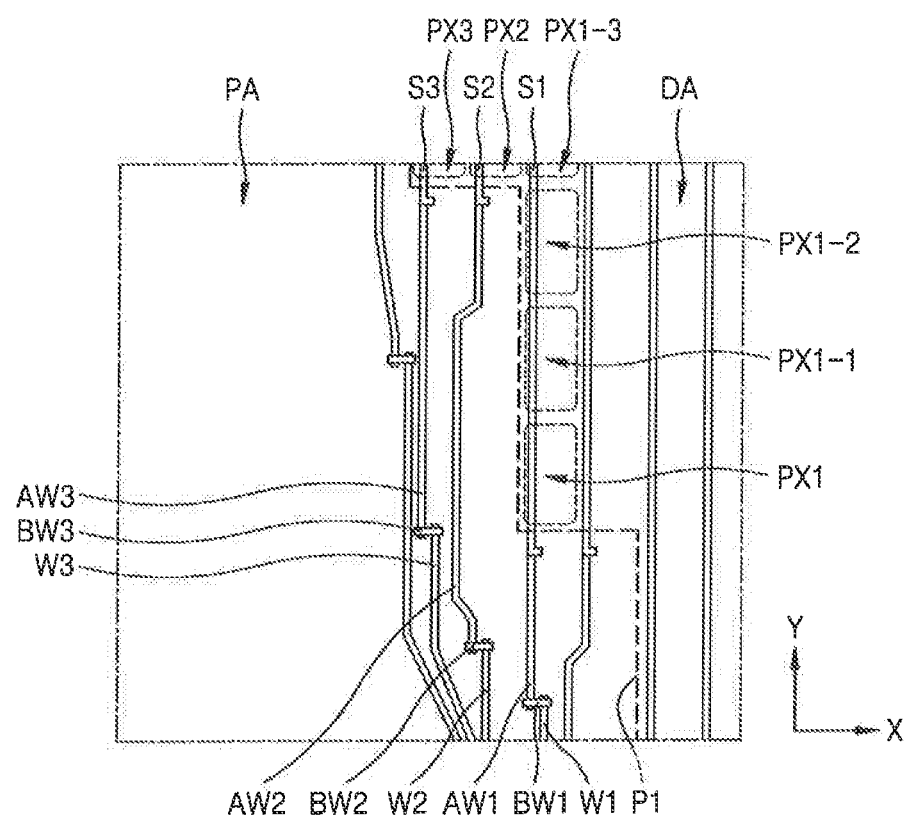
FIG. 3 is a conceptual view schematically illustrating a portion B of FIG. 2.
Figure 4:
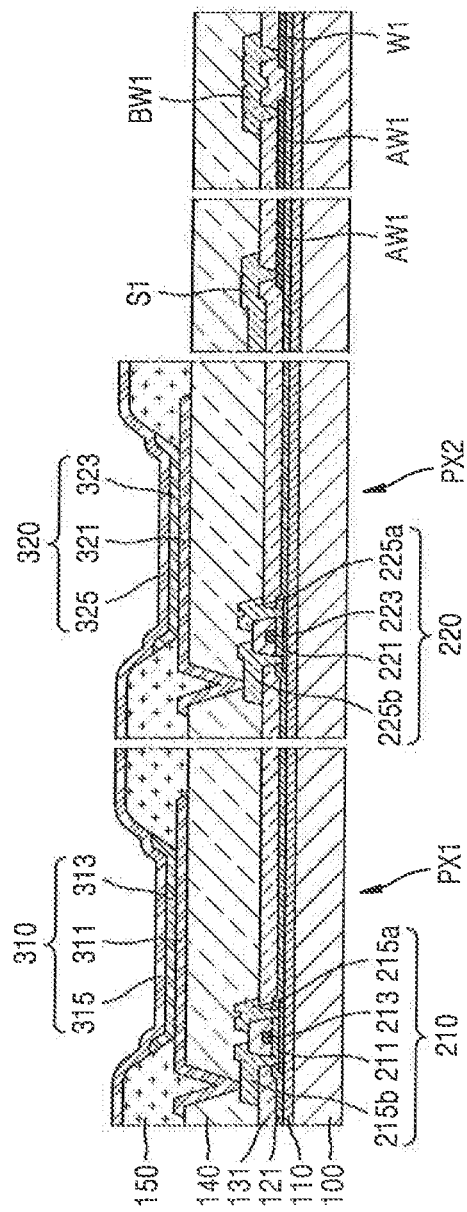
FIG. 4 is a cross-sectional view schematically illustrating portions of FIG. 3.

FIG. 1 is a conceptual view schematically illustrating one aspect of a manufacturing process of a display apparatus according to an exemplary embodiment of the inventive concept. FIG. 2 is a conceptual view schematically illustrating a portion A of FIG. 1. FIG. 3 is a conceptual view schematically illustrating a portion B of FIG. 2. FIG. 4 is a cross-sectional view schematically illustrating portions of FIG. 3.

As illustrated in FIG. 1, the display apparatus according to the present embodiment includes a display area DA in which a plurality of pixels are located and a peripheral area PA located outside the display area DA. In other words, a substrate 100 has the display area DA and the peripheral area PA. The peripheral area PA includes a pad area PADA that is an area where various electric elements or printed circuit boards are electrically attached.

FIG. 1 may be interpreted to be a plan view illustrating a shape of a substrate in a manufacturing process. In a final display apparatus or an electronic apparatus such as a smartphone including the display apparatus, the substrate 100 may be partially bent in order to reduce the area of the peripheral area PA recognized by a user. For example, as illustrated in FIG. 2, the peripheral area PA may include a bending area BA, and the bending area BA may be located between the pad area PADA and the display area DA. In this case, in order to allow a substrate 100 to be bent in the bending area BA, at least a part of the pad area PADA is located overlapping the display area DA. A bending direction is set such that the pad area PADA does not cover the display area DA but is located behind the display area DA. Accordingly, the user may recognize that the display area DA takes up most of the display apparatus.

The substrate 100 may include various materials having flexible or bendable characteristics, for example, a polymer resin such as polyethersulphone (PES), polyacrylate, polyetherimide (PEI), polyethylene naphthalate (PEN), polyethylene terephthalate (PET), polyphenylene sulfide (PPS), polyallylate (PAR), polyimide (PI), polycarbonate (PC), or cellulose acetate propionate (CAP). The substrate 100 may be variously modified, for example, may have a multilayer structure of two layers each including the above polymer resin and one barrier layer including an inorganic material such as silicon oxide, silicon nitride, silicon oxynitride, etc.

In an embodiment, the edge of the display area DA has a shape similar to a rectangle or a square as a whole. However, as illustrated in FIGS. 1 and 2, a first part P1 at the edge of the display area DA has a curved or round shape. As shown in FIG. 1, the display area DA includes a first edge E1 and a second edge E2 facing each other, and a third edge E3 and a fourth edge E4 facing each other and located between the first edge E1 and the second edge E2. The pad area PADA is adjacent the fourth edge E4. The first part P1 having a round shape connects the first edge E1 to the fourth edge E4. In addition to the first part P1, a second part P2 at the edge of the display area DA may have a round shape. The second part P2 connects the second edge E2 to the fourth edge E4. Furthermore, the other portion at the edge of the display area DA may have a round shape.

For reference, FIG. 3 is a conceptual view schematically illustrating a portion B of FIG. 2, showing a part of the first part P1. As illustrated in FIGS. 1 and 2, when observed by a user using the display apparatus according to the present embodiment or an electronic apparatus including the display apparatus in a general use environment, the first part P1 is recognized to have a round shape, that is, a curved shape. However, in an environment in which wirings having a width of several micrometers or several tens of micrometers are observed by magnifying the first part P1, as illustrated in FIG. 3, the first part P1 appears to have multiple bent linear shapes. Even when the first part P1 appears to have multiple bent linear shapes as illustrated in FIG. 3 by magnifying the first part P1, since in the general use environment the first part P1 is recognized to have a round shape, that is, a curved shape, in the following description, the first part P1 is described to have a round shape. A plurality of pixels PX1, PX1-1, PX1-2, PX2, and PX3 are located in the display area DA along the first part P1 having a round shape. For reference, in FIG. 3, only some of the pixels in the display area DA are displayed for convenience of explanation.

A variety of signals may be applied to the display area DA. For example, a data signal to adjust brightness of each pixel may be applied to the display area DA. To this end, various wirings such as data wirings may be located inside and outside of the display area DA. Such wirings are described in the following description.

The display apparatus according to a present exemplary embodiment includes a first wiring W1, a first additional wiring AW1, and a first signal line S1. The first wiring W1 extends in a direction toward the first part P1 such that a first one end thereof is located in the pad area PADA and a first other end thereof is located in the peripheral area PA. Although FIG. 3 illustrates only a part of the first wiring W1, since the first one end of the first wiring W1 is located in the pad area PADA as illustrated in FIGS. 1 and 2, the first wiring W1 may be a long wiring. In addition, since the first wiring W1 has a long shape extending in the direction toward the first part P1 in the pad area PADA, the first wiring W1 may have a multiple bent shapes as illustrated in FIGS. 1 and 2.

The first additional wiring AW1 extends toward the display area DA such that a first additional one end of the first additional wiring AW1 is electrically connected to the first other end of the first wiring W1 and a first additional other end thereof is located in the peripheral area PA. Since both of the first additional one end and the first additional other end of the first additional wiring AW1 are located in the peripheral area PA, the first additional wiring AW1 is located in the peripheral area PA, not in the display area DA. Since the first additional wiring AW1 extends toward the display area DA, the first additional other end of the first additional wiring AW1 is located around the display area DA. To electrically connect the first additional one end of the first additional wiring AW1 to the first other end of the first wiring W1, the display apparatus may further include a first bridge wiring BW1 contacting each of the first additional one end of the first additional wiring AW1 and the first other end of the first wiring W1.

The first signal line S1 is mostly located in the display area DA. However, since one end of the first signal line S1 is located in the peripheral area PA and electrically connected to the first additional other end of the first additional wiring AW1, the first signal line S1 is not located only in the display area DA. In other words, it may be understood that the one end of the first signal line S1 is electrically connected to the first additional other end of the first additional wiring AW1 and the first signal line S1 extends into the inside of the display area DA. The first signal line S1 may be, for example, a data wiring for transmitting a data signal to the pixels located in the display area DA.

In the display apparatus according to the present embodiment configured as discussed above, generation of defects in the pixels at the edge of the display area DA in the manufacturing process may be reduced. In the manufacturing process, not all of the first wiring W1, the first additional wiring AW1, and the first signal line S1 are formed at the same time. For example, while the first wiring W1 and the first additional wiring AW1 are formed of the same material at the same time, the first signal line S1 and the first bridge wiring BW1 may be formed after the first wiring W1 and the first additional wiring AW1 are formed. In other words, the first signal line S1 and the first bridge wiring BW1 may be located in a layer different from a layer where the first wiring W1 and the first additional wiring AW1 are formed.

The first wiring W1 and the first additional wiring AW1 are formed of, for example, metal such as molybdenum or aluminum, in a method such as sputtering. For example, sputtering may include a process whereby particles are ejected from a solid target material due to bombardment of the target by energetic particles. When a first interlayer insulating film 131 (see FIG. 4) is formed after the first wiring W1 and the first additional wiring AW1 are formed, a method such as a plasma enhanced chemical vapor deposition (PECVD) method may be used. For example, PECVD may include a chemical vapor deposition process used to deposit thin films from a gas state to a solid state on a substrate. In this case, electric charges may be accumulated in the first wiring W1 and the first additional wiring AW1 that were previously formed. In particular, since plasma is used when an insulating layer is formed by the PECVD method after the first wiring W1 and the first additional wiring AW1 are formed, electric charges may be accumulated in the first wiring W1 and the first additional wiring AW1 in such a process. Since the first wiring W1 is relatively longer than the first additional wiring AW1 between the first wiring W1 and the first additional wiring AW1, the total amount of electric charges accumulated in the first wiring W1 is greater than the total amount of electric charges accumulated in the first additional wiring AW1.

Instead of forming the first additional wiring AW1, the first wiring W1 may be formed relatively long such that the first other end of the first wiring W1 is located around the display area DA, and that one end of the first signal line S1 is connected to the first other end of the first wiring W1. In this case, before the first signal line S1 is formed, the first wiring W1 is formed such that the first one end of the first wiring W1 is located in the pad area PADA and the first other end thereof is located around the display area DA to have a long shape. Accordingly, in the process of forming the insulating layer after the first wiring W1 is formed, a very large amount of electric charges is accumulated in the first wiring W1.

A semiconductor layer that is a constituent element of a thin film transistor and an insulating layer covering the semiconductor layer are formed in the display area DA. In this state, such a long first wiring W1 is formed. Accordingly, in this case, a strong electromagnetic field may be formed due to a large electric potential difference between the first other end of the first wiring W1 located around the display area DA and the semiconductor layer that is to be a constituent element of a thin film transistor in a pixel in the display area DA. This is possible because a large amount of electric charges are accumulated in the first wiring W1. Then, due to the strong electromagnetic field, a phenomenon such as insulation breakdown (dielectric breakdown) may occur in the insulating layer covering the semiconductor layer. Even when a thin film transistor is completed later, the thin film transistor may not operate properly. As a result, the pixel may become a defective pixel.

The display apparatus according to the present embodiment may prevent or reduce the occurrence of such a problem. In other words, the first wiring W1 that is relatively longer between the first wiring W1 and the first additional wiring AW1 is located such that the first other end of the first wiring W1 is not located close to the display area DA, but is located spaced apart by a certain distance from the display area DA. Accordingly, even when a large amount of electric charges are accumulated in the first wiring W1 in the manufacturing process, insulation breakage may not occur between the first wiring W1 and the insulating layer covering the semiconductor layer in the display area DA. Accordingly, in the display apparatus according to the present embodiment, the generation of a defective pixel in the manufacturing process may be prevented or reduced. Although the first additional other end of the first additional wiring AW1 is located around the display area DA, the first additional wiring AW1 is shorter than the first wiring W1 and thus the amount of electric charge accumulated in the first additional wiring AW1 in the manufacturing process is not large. Accordingly, the insulation breakage may not occur between the insulating layer covering the semiconductor layer in the display area DA and the first additional other end of the first additional wiring AW1.

The first wiring W1 and the first additional wiring AW1 are electrically connected to each other by forming the first bridge wiring BW1 after the first wiring W1 and the first additional wiring AW1 are formed. In this case, however, when the first bridge wiring BW1 is formed, the first signal line S1 electrically connected to the first additional wiring AW1 is formed of the same material at the same time, and thus a large amount of electric charges accumulated in the first wiring W1 may be moved not only toward the first additional wiring AW1, but also toward the first signal line S1, through the first bridge wiring BW1. The first signal line S1 extends in a y-axis direction to pass through the pixels PX1, PX1-1, PX1-2, and PX1-3 in the display area DA. For example, the first signal line S1 has a long shape extending from the vicinity of the fourth edge E4 toward the vicinity of the third edge E3. Accordingly, the electric charges accumulated in the first wiring W1 spread along the first additional wiring AW1 and the first signal line S1, not forming a locally strong electromagnetic field at a particular location. Accordingly, insulation breakage in the insulating layer may not occur. For reference, the first signal line S1 may include metal such as titanium or aluminum or may have a single layer or a multilayer. For example, the first signal line S1 may have a trilayer structure of titanium/aluminum/titanium.

In the above described display apparatus, the first other end of the first wiring W1 may be closer to the display area DA in an x-axis direction than the first additional one end of the first additional wiring AW1. Although only the first wiring W1 is described in the above description, as described below, a second wiring W2 and a third wiring W3 are present, and the first wiring W1 to the third wiring W3 have a shape extending from the pad area PADA in a direction toward the display area DA. In this state, the first wiring W1 to the third wiring W3 have a shape of gradually spreading from the pad area PADA in the direction toward the display area DA. Considering the layout of the first wiring W1 to the third wiring W3 having a spread-out shape and the first additional wiring AW1 to the third additional wiring AW3 connected thereto, the first other end of the first wiring W1 may be closer to the display area DA in the x-axis direction than the first additional one end of the first additional wiring AW1. That is, the first additional one end of the first additional wiring AW1 may be farther away from the display area DA in the x-axis direction than the first other end of the first wiring W1.

The first wiring W1 connected to the first signal line S1 may transmit electrical signals such as data signals to the pixels PX1, PX1-1, PX1-2, and PX1-3 of a first row. The electrical signals such as data signals should be transmitted to the pixels of a row other than the first row. To this end, other wirings may be arranged in the peripheral area PA. For example, as illustrated in FIG. 3, the second wiring W2 may be arranged in the peripheral area PA. In FIG. 3, the second wiring W2 extends in the direction toward the first part P1 such that a second one end of the second wiring W2 is located in the pad area PADA and a second other end of the second wiring W2 is located in the peripheral area PA. The second wiring W2 is illustrated to be arranged closer to the first edge E1 (see FIG. 1) than the first wiring W1. The second wiring W2 transmits an electrical signal to the pixel PX2. To this end, the second wiring W2 is electrically connected to a second signal line S2 via a second bridge wiring BW2 and a second additional wiring AW2.

The second additional wiring AW2 extends toward the display area DA such that a second additional one end of the second additional wiring AW2 is electrically connected to the second other end of the second wiring W2 via the second bridge wiring BW2, and a second additional other end of the second additional wiring AW2 is located in the peripheral area PA. The second additional wiring AW2 as well is arranged closer to the first edge E1 than the first additional wiring AW1. The second additional other end of the second additional wiring AW2 is electrically connected to one end of the second signal line S2, and the second signal line S2 extends in the y-axis direction toward the inside of the display area DA and transmits an electrical signal to the pixel PX2.

The above description about the positional relationship among the first wiring W1, the first bridge wiring BW1, the first additional wiring AW1, and the first signal line S1 may be applied, without change, to the positional relationship among the second wiring W2, the second bridge wiring BW2, the second additional wiring AW2, and the second signal line S2. In this state, a second position where the second other end of the second wiring W2 and the second additional one end of the second additional wiring AW2 are connected to each other, that is, a position where the second bridge wiring BW2 is located, may be located farther away from the pad area PADA than a first position where the first other end of the first wiring W1 and the first additional one end of the first additional wiring AW1 are connected to each other, that is, a position where the first bridge wiring BW1 is located. In FIG. 3, the position of the second bridge wiring BW2 is illustrated to be located farther away from the pad area PADA in a +y direction than the position of the first bridge wiring BW1. Assuming an imaginary straight line including the fourth edge E4 (see FIG. 2), the shortest distance of the second bridge wiring BW2 from the imaginary straight line is greater than the shortest distance of the first bridge wiring BW1 from the imaginary straight line.

As illustrated in FIG. 3, the third wiring W3 is arranged closer to the first edge E1 (see FIG. 1) than the first wiring W1 and the second wiring W2. The third wiring W3 is electrically connected to a third signal line S3 via a third bridge wiring BW3 and the third additional wiring AW3 and applies an electrical signal to the pixel PX3. In this case, the third bridge wiring BW3 is located farther from the pad area PADA than the position where the second bridge wiring BW2 is located. This is because the first part P1 of the edge of the display area DA has a round shape and thus there is a need to adjust the positions of the first bridge wiring BW1 relative to the third bridge wiring BW3 according to the shape of the first part P1. In an embodiment, the second bridge wiring BW2 is located between the first and third bridge wirings BW1 and BW3.

As the length of each of the first additional wiring AW1 to the third additional wiring AW3 increases, the amount of electric charges accumulated in the wirings increases as well. Accordingly, a possibility of occurrence of defects in the pixels of an adjacent display area may increase. Thus, it is necessary to prevent the length of each of the first additional wiring AW1 to the third additional wiring AW3 from being increased.

To this end, the length of each of the first additional wiring AW1 to the third additional wiring AW3 is prevented from being increased by adjusting the positions of the first bridge wiring BW1 to the third bridge wiring BW3 according to the shape of the first part P1 having a round shape. The adjusted positions of the first bridge wiring BW1 to the third bridge wiring BW3 are the same as those described above. In other words, the third bridge wiring BW3 may be located farther from the pad area PADA than the position where the second bridge wiring BW2 is located, and the second bridge wiring BW2 may be located farther from the pad area PADA than the position where the first bridge wiring BW1 is located.

As described above, since the first wiring W1 and the first additional wiring AW1 are formed of the same material at the same time in the manufacturing process, the first wiring W1 and the first additional wiring AW1 may include the same material. The first wiring W1 and the first additional wiring AW1 may be located on the same layer. As described above, since the first signal line S1 and the first bridge wiring BW1 are formed of the same material at the same time, the first signal line S1 and the first bridge wiring BW1 may include the same material. The first signal line S1 and the first bridge wiring BW1 may be located on the same layer. If necessary, a first additional bridge wiring located above the first bridge wiring BW1 and having both ends connected to the first bridge wiring BW1 may be further provided. In this case, since the first bridge wiring BW1 and the first additional bridge wiring are parallelly connected to each other, an effect of reducing total resistance may be obtained considering the first bridge wiring BW1 and the first additional bridge wiring.

In the following description, the present embodiment is described in detail with reference to FIG. 4 that is a cross-sectional view schematically illustrating portions of FIG. 3. FIG. 4 is a cross-sectional view illustrating portions spaced apart from one another in FIG. 3, which does not illustrate constituent elements adjacent to one another. For example, FIG. 4 illustrates a pixel PX1 and a pixel PX2. As illustrated in FIG. 3, the pixel PX1 and the pixel PX2 are not the pixels located adjacent each other. Furthermore, FIG. 4 is a cross-sectional view illustrating portions spaced apart from one another in FIG. 3, in which cross-sections at the portions spaced apart from one another are not taken in the same direction. For example, in the case of a cross-section illustrating the first signal line S1 and the first additional wiring AW1 altogether, the cross-section is taken in a direction (y-axis direction) in which the first signal line S1 extends, and in the case of a cross-section illustrating the first additional wiring AW1, the first wiring W1, and the first bridge wiring BW1 altogether, the cross-section is taken in a direction (x-axis direction) in which the first bridge wiring BW1 extends.

As illustrated in FIG. 4, in the display area DA of the substrate 100, in addition to first and second display elements 310 and 320, a first thin film transistor 210 is disposed electrically connected to the first display element 310 and a second thin film transistor 220 is disposed electrically connected to the second display element 320. FIG. 4 illustrates that organic light-emitting elements such as the first and second display elements 310 and 320 are located in the display area DA. The electrical connection of the organic light-emitting elements to the first and second thin film transistors 210 and 220 may be understood to be a first pixel electrode 311 electrically connected to the first thin film transistor 210 and a second pixel electrode 321 electrically connected to the second thin film transistor 220.

For reference, in FIG. 4, the first thin film transistor 210 is located at the pixel PX1, the second thin film transistor 220 is located at the pixel PX2, the first display element 310 is electrically connected to the first thin film transistor 210, and the second display element 320 is electrically connected to the second thin film transistor 220. In the following description, for convenience of explanation, the first thin film transistor 210 and the first display element 310 are described, and the description thereof may be applied to the second thin film transistor 220 and the second display element 320. In other words, descriptions of a second semiconductor layer 221, a second gate electrode 223, a second source electrode 225a, and a second drain electrode 225b of the second thin film transistor 220, and descriptions of the pixel electrode 321, an opposite electrode 325, and an intermediate layer 323 of the second display element 320, are omitted. For reference, the opposite electrode 325 of the second display element 320 may be integrally formed with an opposite electrode 315 of the first display element 310.

The first thin film transistor 210 includes a first semiconductor layer 211. The first semiconductor layer 211 may include amorphous silicon, polycrystalline silicon, or an organic semiconductor material. The first thin film transistor 210 further includes a first gate electrode 213, a first source electrode 215a, and a first drain electrode 215b. To secure insulation between the first semiconductor layer 211 and the first gate electrode 213, a first gate insulating film 121 including an inorganic material such as silicon oxide, silicon nitride, and/or silicon oxynitride may be interposed between the first semiconductor layer 211 and the first gate electrode 213. The first interlayer insulating film 131 may include an inorganic material such as silicon oxide, silicon nitride, and/or silicon oxynitride. In an embodiment, the first interlayer insulating film 131 is arranged over the first gate electrode 213, and the first source electrode 215a and the first drain electrode 215b is arranged on the first interlayer insulating film 131. The insulating film including the inorganic material (e.g., the first gate insulating film 121) may be formed by a chemical vapor deposition (CVD) method or an atomic layer deposition (ALD) method. For example, the CVD method may include exposing a substrate to one or more volatile precursor, which react and/or decompose on the substrate surface to produce a desired deposit. The ALD method may include a thin film deposition technique that is based on sequential use of a gas phase chemical process.

A buffer layer 110 may include an inorganic material such as silicon oxide, silicon nitride, and/or silicon oxynitride. The buffer layer 110 may be interposed between the first thin film transistor 210 and the substrate 100 having the above structure. The buffer layer 110 may improve smoothness of an upper surface of the substrate 100, or prevent or reduce intrusion of impurities from the substrate 100 into the first semiconductor layer 211 of the first thin film transistor 210.

A planarization layer 140 may be arranged on the first thin film transistor 210. For example, as illustrated in FIG. 4, when an organic light-emitting element is arranged over the first thin film transistor 210, the planarization layer 140 may roughly planarize an upper surface of a protection film covering the first thin film transistor 210. The planarization layer 140 may be formed of an organic material, for example, acryl, benzocyclobutene (BCB), or hexamethyldisiloxane (HMDSO). Although the planarization layer 140 is illustrated to be a single layer in FIG. 4, in an alternate embodiment the planarization layer 140 is a multilayer.

In an embodiment of the display area DA of the substrate 100, the first display element 310 is located on the planarization layer 140. The first display element 310 may be, for example, an organic light-emitting element including the pixel electrode 311, the opposite electrode 315, and an intermediate layer 313 interposed therebetween and having a light-emitting layer. In an embodiment, the pixel electrode 311 is electrically connected to the first thin film transistor 210 by contacting any one of the first source electrode 215a and the first drain electrode 215b via an opening portion formed in the planarization layer 140. For example, while FIG. 4 shows the pixel electrode 311 being electrically connected to the first drain electrode 215b via the opening, in an alternate embodiment, the pixel electrode 311 is instead electrically connected to the first source electrode 215a through the opening.

A pixel defining layer 150 may be arranged over the planarization layer 140. The pixel defining layer 150 has an opening corresponding to each of sub-pixels, that is, an opening to have at least a center portion of the pixel electrode 311 exposed, thereby defining a pixel. Furthermore, as illustrated in FIG. 4, the pixel defining layer 150 prevents generation of an arc at an edge of the pixel electrode 311 by increasing a distance between the edge of the pixel electrode 311 and the opposite electrode 315 over the pixel electrode 311. The pixel defining layer 150 may be formed of, for example, an organic material such as polyimide or HMDSO.

The intermediate layer 313 of the organic light-emitting element may include a low molecular or polymer material. When the intermediate layer 313 includes a low molecular material, the intermediate layer 313 may have a structure in which a hole injection layer (HIL), a hole transport layer (HTL), an emission layer (EML), an electron transport layer (ETL), and an electron injection layer (EIL) are stacked in a single or composite structure, and may be formed by a vacuum deposition method. When the intermediate layer 313 includes a polymer material, the intermediate layer 313 may have a structure including the HTL and the EML. In this state, the HTL may include PEDOT, and the EML may include a polymer material such as a poly-phenylenevinylene (PPV) base and a polyfluorene base. In an embodiment, PEDOT is poly(3,4-ethylenedioxythiophene). The intermediate layer 313 may be formed by a screen printing method, an inkjet printing method, or a laser induced thermal imaging (LITI) method. The intermediate layer 313 is not necessarily limited thereto and may have various structures. The intermediate layer 313 may include a layer that is integrally arranged across the pixel electrodes 311 and 321, or may include a layer patterned corresponding to each of the pixel electrodes 311 and 321.

The opposite electrode 315 may be arranged over the display area DA to cover the display area DA. In an embodiment, the opposite electrode 315 is integrally formed with respect to a plurality of organic light-emitting elements and corresponds to the pixel electrodes 311 and 321.

Since the organic light-emitting element may be damaged by external moisture or oxygen, in an exemplary embodiment, an encapsulation layer (not shown) is provided to protect the organic light-emitting element by covering the organic light-emitting element. The encapsulation layer covers the display area DA and may extend to at least a part of the peripheral area PA. The encapsulation layer may include a first inorganic encapsulation layer, an organic encapsulation layer, and a second inorganic encapsulation layer.

As described above, since the first wiring W1 and the first additional wiring AW1 are formed of the same material at the same time in the manufacturing process, the first wiring W1 and the first additional wiring AW1 may include the same material. In an exemplary embodiment, when the first gate electrode 213 is formed, the first wiring W1 and the first additional wiring AW1 are simultaneously formed of the same material on the first gate insulating film 121. Accordingly, the first wiring W1 and the first additional wiring AW1 include the same material as the first gate electrode 213 and are arranged on the same layer. As described above, the first signal line S1 and the first bridge wiring BW1 are formed of the same material at the same time. In an embodiment, when the first source electrode 215a and the first drain electrode 215b are formed, the first signal line S1 and the first bridge wiring BW1 are simultaneously formed of the same material on the first interlayer insulating film 131.

Accordingly, the first signal line S1 and the first bridge wiring BW1 include the same material as the first source electrode 215a and the first drain electrode 215b, and are arranged on the same layer.

Considering the manufacturing process, after the first gate electrode 213, the first wiring W1, and the first additional wiring AW1 are formed, the first interlayer insulating film 131 covering them is formed. Even when a large amount of electric charges are accumulated in the first wiring W1 in the process of forming other insulating layers after the first wiring W1 is formed, since the first one end of the first wiring W1 is located in the pad area PADA and the first other end thereof is located spaced apart by a certain distance from the display area DA, the generation of the above-described defect in the display area DA by a large amount of electric charges accumulated in the first wiring W1 may be prevented. Although the first additional one end of the first additional wiring AW1 is located close to the first other end of the first wiring W1 and the first additional other end thereof is located close to the display area DA, since the amount of accumulated electric charges in the first additional wiring AW1 is not large due to the short length of the first additional wiring AW1, no defect is generated in the display area DA due to the accumulated electric charges.

In an embodiment, a plurality of contact holes are then formed in the first interlayer insulating film 131, and the first source electrode 215a, the first drain electrode 215b, the first signal line S1, and the first bridge wiring BW1 are simultaneously formed. Accordingly, the first signal line S1 contacts the first additional other end of the first additional wiring AW1 via one of the contact holes, and the first bridge wiring BW1 contacts each of the first additional one end of the first additional wiring AW1 and the first other end of the first wiring W1 via the one or more of the contact holes. As such, since the first signal line S1 and the first bridge wiring BW1 are simultaneously formed, the electric charges accumulated in the first wiring W1 instantly spread along the first additional wiring AW1 and the first signal line S1, Accordingly, no locally strong electromagnetic field is formed and thus a defect is not generated in the display area DA.

Figure 5:
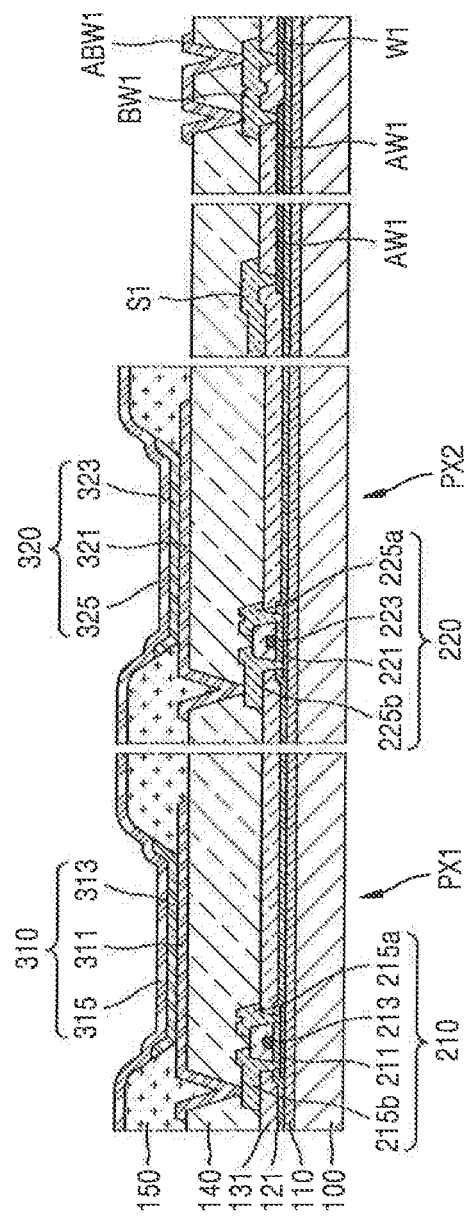
FIG. 5 is a cross-sectional view schematically illustrating portions of a display apparatus according to an exemplary embodiment of the inventive concept.

FIG. 5 is a cross-sectional view schematically illustrating portions of a display apparatus according to an exemplary embodiment of the inventive concept. Different from the display apparatus described in FIG. 4, the display apparatus of FIG. 5 further includes a first additional bridge wiring ABW1.

In the manufacturing process, after the planarization layer 140 covering the first source electrode 215a, the first drain electrode 215b, the first signal line S1, and the first bridge wiring BW1 is formed, and contact holes to connect the pixel electrodes 311 and 321 respectively to the first thin film transistor 210 and the second thin film transistor 220 are formed in the planarization layer 140, the pixel electrodes 311 and 321 are formed on the planarization layer 140. When the contact holes are formed, contact holes to expose the first bridge wiring BW1 are simultaneously formed, and when the pixel electrodes 311 and 321 are formed, the first additional bridge wiring ABW1 having both ends connected to the first bridge wiring BW1 via the contact holes may be formed of the same material at the same time. In this case, since the first bridge wiring BW1 and the first additional bridge wiring ABW1 are parallelly connected to each other, considering the first bridge wiring BW1 and the first additional bridge wiring ABW1, total resistance may be reduced.

Figure 6:
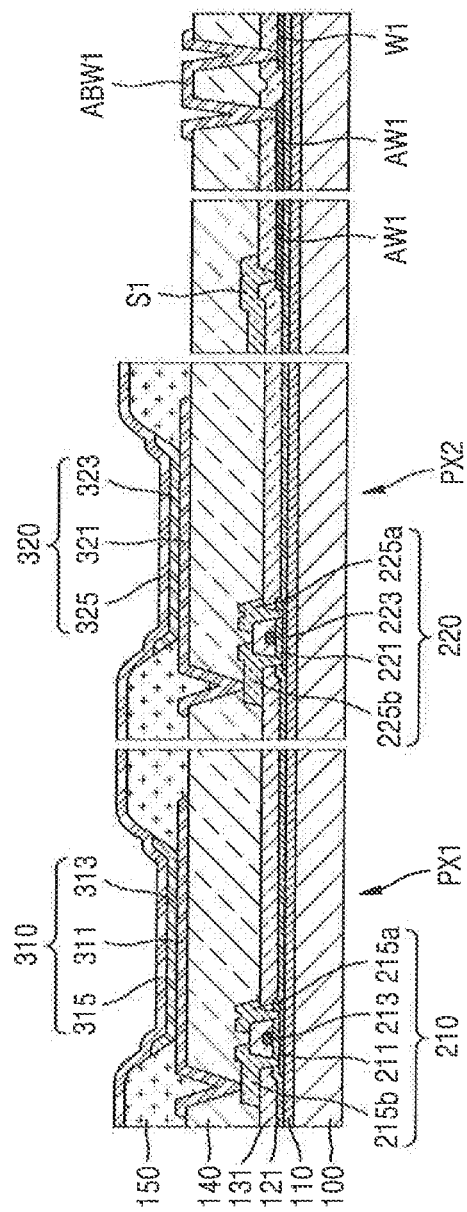
FIG. 6 is a cross-sectional view schematically illustrating portions of a display apparatus according to an exemplary embodiment of the inventive concept.

However, the present disclosure is not limited thereto. For example, the cross-sectional view of FIG. 6 schematically illustrates portions of a display apparatus according to another exemplary embodiment where only the first additional bridge wiring ABW1 is present without the first bridge wiring BW1. In other words, since the first additional bridge wiring ABW1 contacts the first other end of the first wiring W1 and the first additional one end of the first additional wiring AW1, the first wiring W1 and the first additional wiring AW1 become electrically connected to each other. The first additional bridge wiring ABW1 may be formed of the same material at the same time when the pixel electrodes 311 and 321 are formed.

In the display apparatus according to the present embodiment, since the first one end of the first wiring W1 in which a large amount of electric charges are accumulated is located in the pad area PADA, and the first other end thereof is located spaced apart by a certain distance from the pad area PADA, the generation of a defect in the display area DA by the large amount of electric charges accumulated in the first wiring W1 may be prevented. In addition, the first wiring W1 in which a large amount of electric charges are accumulated is electrically connected to the first additional wiring AW1 and the first signal line S1 by the first additional bridge wiring ABW1 after the thin film transistors 210 and 220 are completely formed in the display area DA. Accordingly, the generation of a defect in the thin film transistors 210 and 220 in the manufacturing process may be effectively prevented or reduced.

Figure 7:
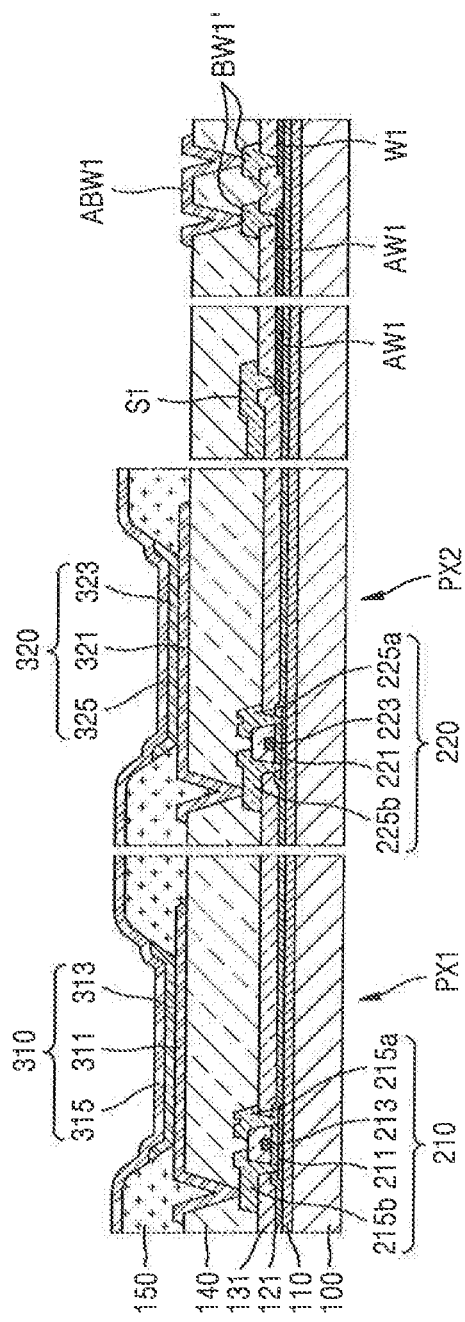
FIG. 7 is a cross-sectional view schematically illustrating portions of a display apparatus according to an exemplary embodiment of the inventive concept.

The cross-sectional view of FIG. 7 schematically illustrates portions of a display apparatus according to an exemplary embodiment of the inventive concept where the first additional bridge wiring ABW1 is indirectly connected to the first other end of the first wiring W1 and the first additional one end of the first additional wiring AW1. In other words, connection layers BW1' that include the same material as the first source electrode 215a and the first drain electrode 215b, are located on the same layer, and are spaced apart from each other. One of the connection layers BW1' is interposed between the first additional wiring AW1 and the first additional bridge wiring ABW1, and the other one of the connection layers BW1' is interposed between the first wiring W1 and the first additional bridge wiring ABW1. Thus, the first additional bridge wiring ABW1 may be electrically connected to the first other end of the first wiring W1 and the first additional one end of the first additional wiring AW1. The connection layers BW1' that are spaced apart from each other may be formed at the same time when the first source electrode 215a and the first drain electrode 215b are formed.

Figure 8:
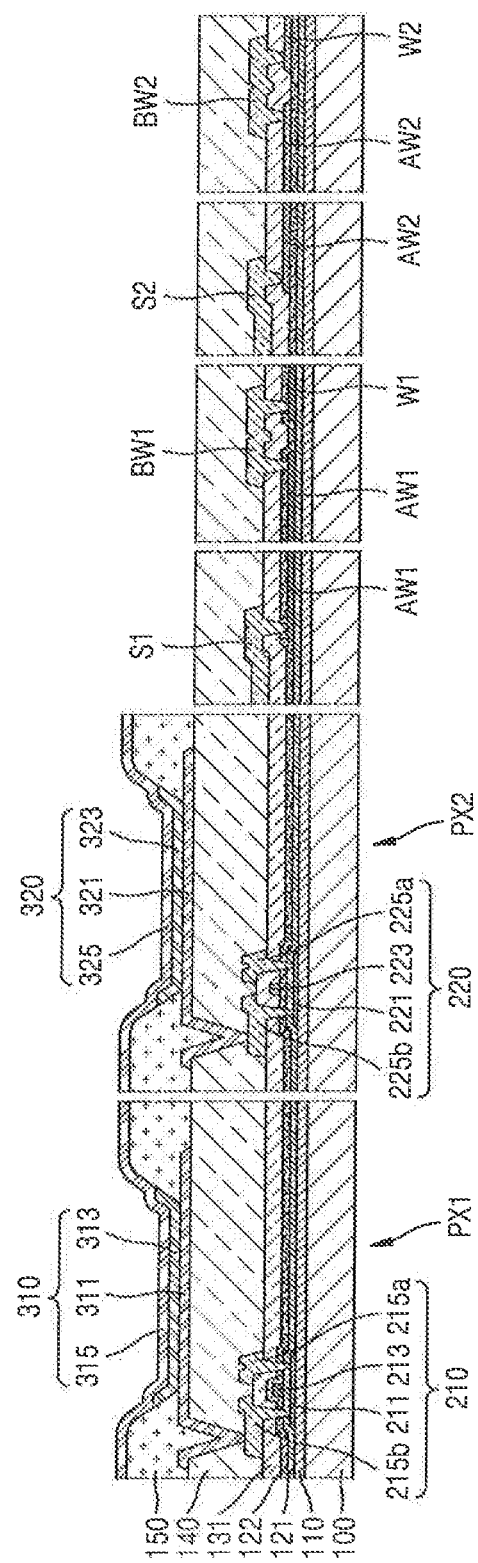
FIG. 8 is a cross-sectional view schematically illustrating portions of a display apparatus according to an exemplary embodiment of the inventive concept.

FIG. 8 is a cross-sectional view schematically illustrating portions of a display apparatus according to an exemplary embodiment of the inventive concept. Different from the display apparatus of FIG. 4, the display apparatus of FIG. 8 further includes a second gate insulating film 122 covering the first gate electrode 213 of the first thin film transistor 210, in addition to the first gate insulating film 121, and the second gate electrode 223 of the second thin film transistor 220 is located on the second gate insulating film 122. In other words, the first gate electrode 213 and the second gate electrode 223 are located at different layers. The first source electrode 215a, the first drain electrode 215b, the second source electrode 225a, and the second drain electrode 225b are located on the first interlayer insulating film 131 covering the first gate electrode 213 and the second gate electrode 223.

The second gate insulating film 122 extends toward the peripheral area PA and covers the first wiring W1 and the first additional wiring AW1. Even in this state, the first signal line S1 contacts the first additional wiring AW1 via a contact hole that penetrates through the second gate insulating film 122 and the first interlayer insulating film 131, and the first bridge wiring BW1 also contacts the first additional wiring AW1 and the first wiring W1 via a contact hole that penetrates through the second gate insulating film 122 and the first interlayer insulating film 131.

In the case of the display apparatus according to the present embodiment, the locations of the second wiring W2 and the second additional wiring AW2 may be different from those of the first wiring W1 and the first additional wiring AW1. In other words, while the first wiring W1 and the first additional wiring AW1 are located on the first gate insulating film 121 like the first gate electrode 213, the second wiring W2 and the second additional wiring AW2 may be located on the second gate insulating film 122 like the second gate electrode 223. In this case, the first wiring W1 and the first additional wiring AW1 include the same material as the first gate electrode 213, and the second wiring W2 and the second additional wiring AW2 include the same material as the second gate electrode 223. In the manufacturing process, the first wiring W1 and the first additional wiring AW1 may be simultaneously formed with the first gate electrode 213, and the second wiring W2 and the second additional wiring AW2 may be simultaneously formed with the second gate electrode 223.

As the resolution of a display apparatus increases, an interval between the first wiring W1 and the second wiring W2 decreases as well. If the first wiring W1 and the second wiring W2 are located on the same layer, to prevent them from being electrically connected to each other, the width of each of the first wiring W1 and the second wiring W2 decreases, which may result in a resistance increase in the first wiring W1 and the second wiring W2. However, in the case of the display apparatus according to the present embodiment, since the first wiring W1 and the second wiring W2 are located on different layers, even when each of the first wiring W1 and the second wiring W2 has a sufficient width, the first wiring W1 and the second wiring W2 are not electrically connected to each other. This is applied to the first additional wiring AW1 and the second additional wiring AW2.

Although FIG. 8 illustrates that the first wiring W1 and the first additional wiring AW1 which are electrically connected to the pixel PX1 are located on the same layer as the first gate electrode 213, and that the second wiring W2 and the second additional wiring AW2 which are electrically connected to the pixel PX2 are located on the same layer as the second gate electrode 223, the present disclosure is not limited thereto. For example, unlike the illustration in FIG. 8, the first wiring W1 and the first additional wiring AW1 which are electrically connected to the pixel PX1 may be located on the same layer as the second gate electrode 223, and the second wiring W2 and the second additional wiring AW2 which are electrically connected to the pixel PX2 may be located on the same layer as the first gate electrode 213.

Figure 9:
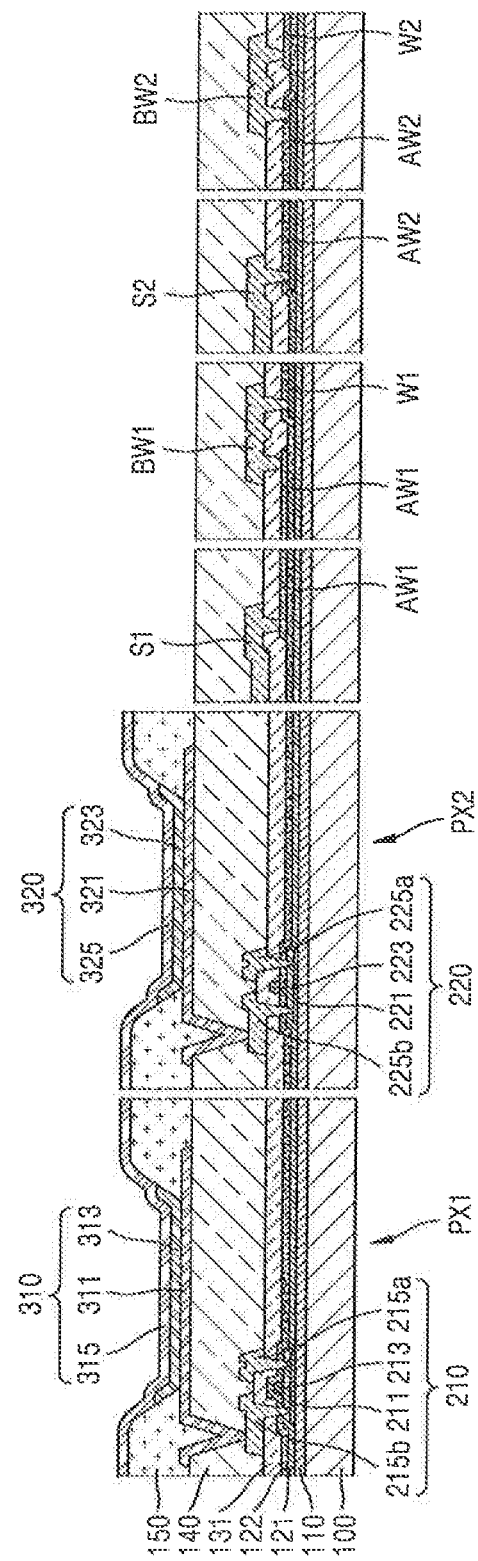
FIG. 9 is a cross-sectional view schematically illustrating portions of a display apparatus according to an exemplary embodiment of the inventive concept.

However, the present disclosure is not limited thereto. For example, the cross-sectional view of FIG. 9 schematically illustrates portions of a display apparatus according to an exemplary embodiment where the first wiring W1 and the second additional wiring AW2 are located on the same layer as the first gate electrode 213, and the second wiring W2 and the first additional wiring AW1 are located on the same layer as the second gate electrode 223. In this case, the first wiring W1 and the second additional wiring AW2 may include the same material as the first gate electrode 213, and the second wiring W2 and the first additional wiring AW1 may include the same material as the second gate electrode 223.

Figure 10:
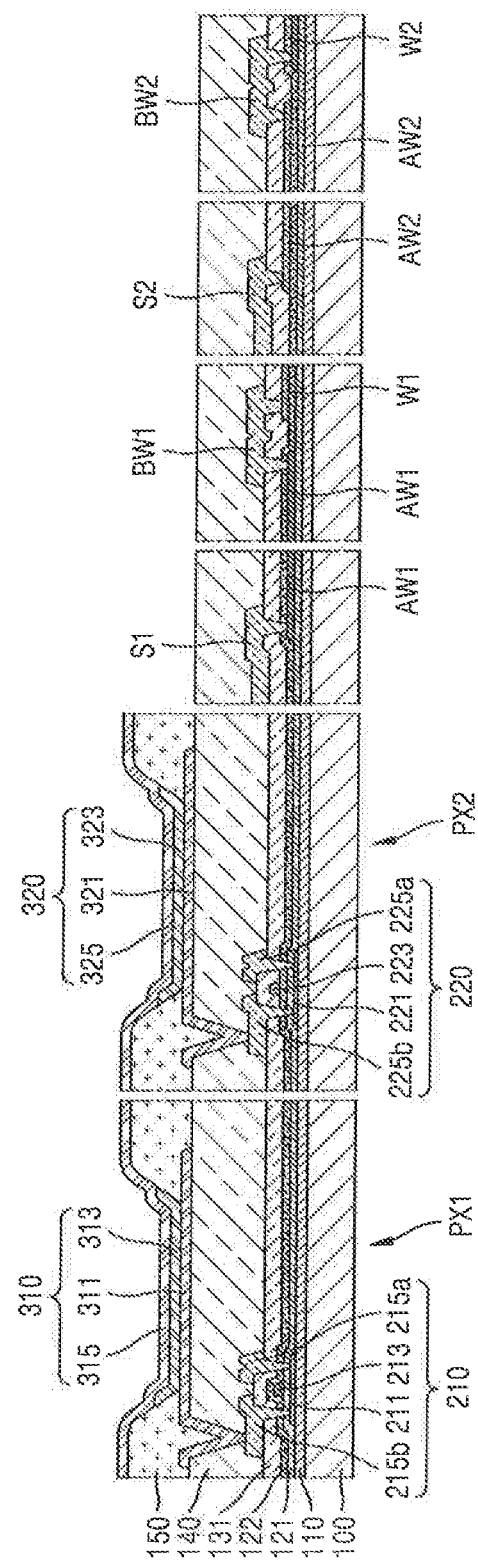
FIG. 10 is a cross-sectional view schematically illustrating portions of a display apparatus according to an exemplary embodiment of the inventive concept.

The cross-sectional view of FIG. 10 illustrates portions of a display apparatus according to another embodiment where the second wiring W2 and the first additional wiring AW1 are located on the same layer as the first gate electrode 213, and the first wiring W1 and the second additional wiring AW2 are located on the same layer as the second gate electrode 223. In this case, the second wiring W2 and the first additional wiring AW1 may include the same material as the first gate electrode 213, and the first wiring W1 and the second additional wiring AW2 may include the same material as the second gate electrode 223.

Figure 11:
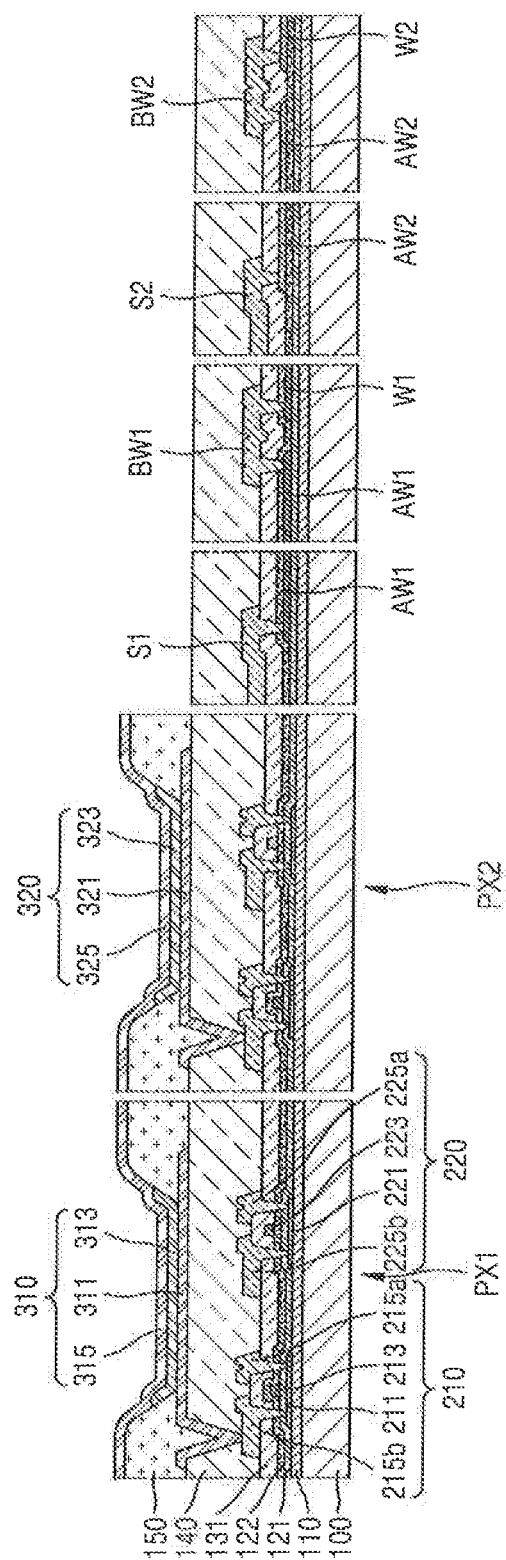
FIG. 11 is a cross-sectional view schematically illustrating portions of a display apparatus according to an exemplary embodiment of the inventive concept.
Figure 12:
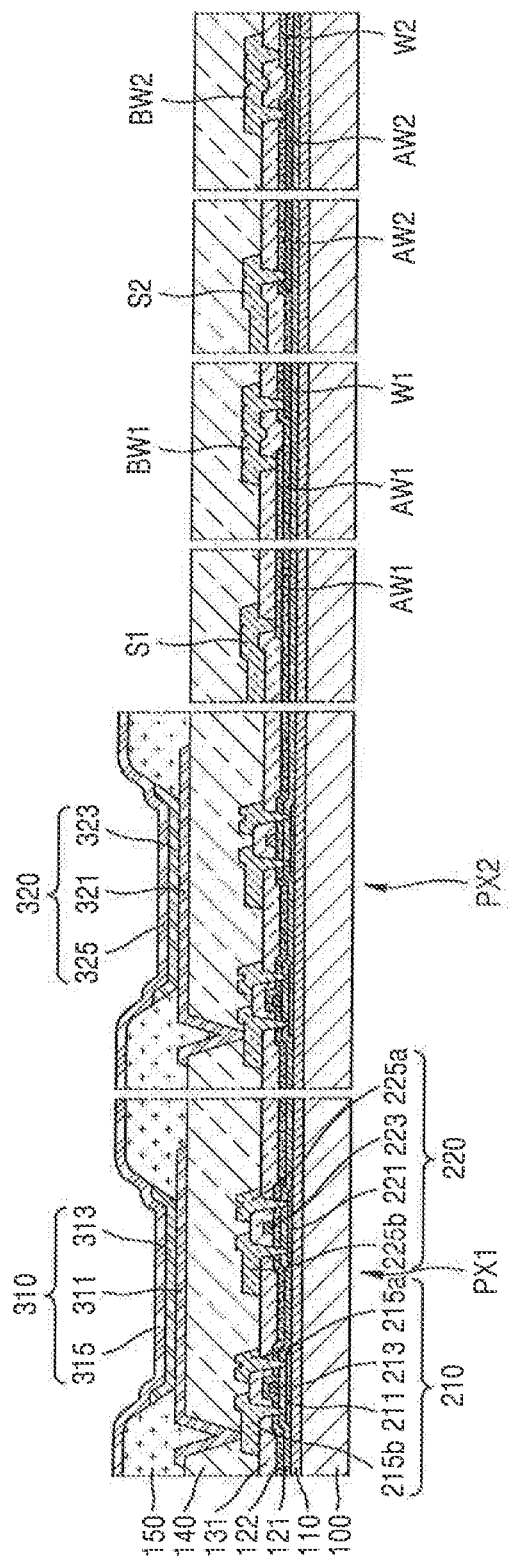
FIG. 12 is a cross-sectional view schematically illustrating portions of a display apparatus according to an exemplary embodiment of the inventive concept.
Figure 13:
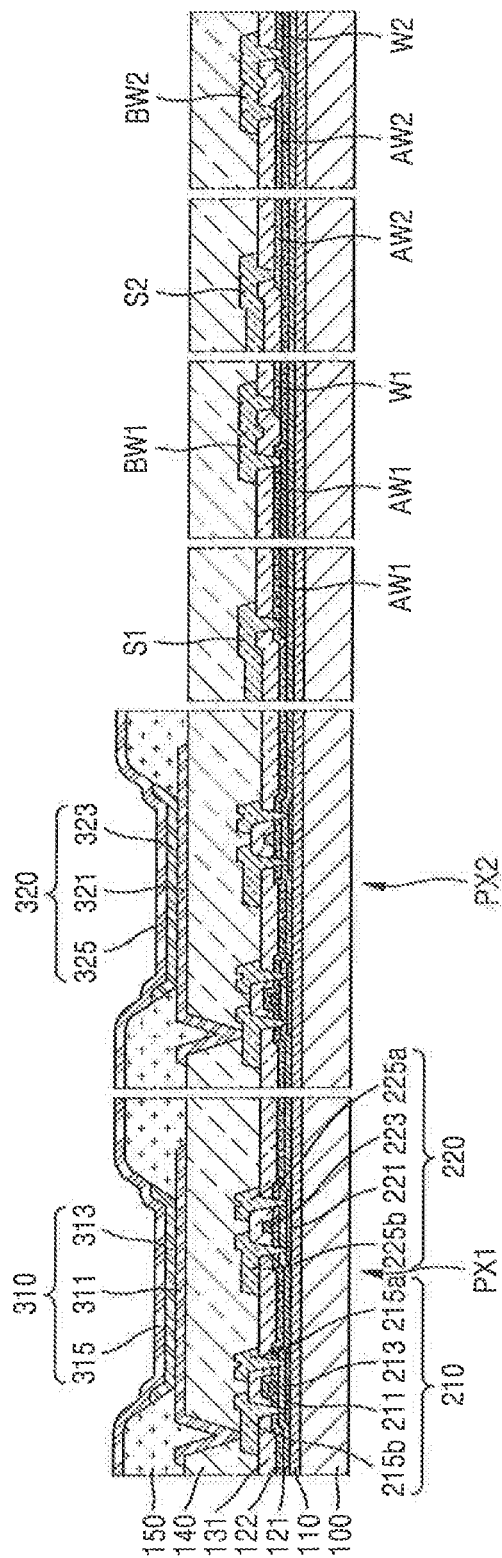
FIG. 13 is a cross-sectional view schematically illustrating portions of a display apparatus according to an exemplary embodiment of the inventive concept.

Although FIGS. 8 to 10 illustrate that the first thin film transistor 210 is located at the pixel PX1 and the second thin film transistor 220 is located at the pixel PX2, the present disclosure is not limited thereto. As illustrated in FIGS. 11 to 13 that are cross-sectional views schematically illustrating portions of each of display apparatuses according to other embodiments, the second thin film transistor 220 as well as the first thin film transistor 210 may belong to the pixel PX1. In other words, in the first thin film transistor 210 and the second thin film transistor 220 which belong to one pixel, that is, the pixel PX1, the first gate electrode 213 of the first thin film transistor 210 and the second gate electrode 223 of the second thin film transistor 220 may be located on different layers. The pixel PX2 may also have a thin film transistor having the same structure as the first thin film transistor 210 and the second thin film transistor 220 which belong to the pixel PX1. The descriptions about the first wiring W1, the second wiring W2, the first additional wiring AW1, the second additional wiring AW2, the first signal line S1, and the second signal line S2 in the embodiments described with reference to FIGS. 8 to 10 may be applied to the display apparatuses illustrated in FIGS. 11 to 13.

Figure 14:
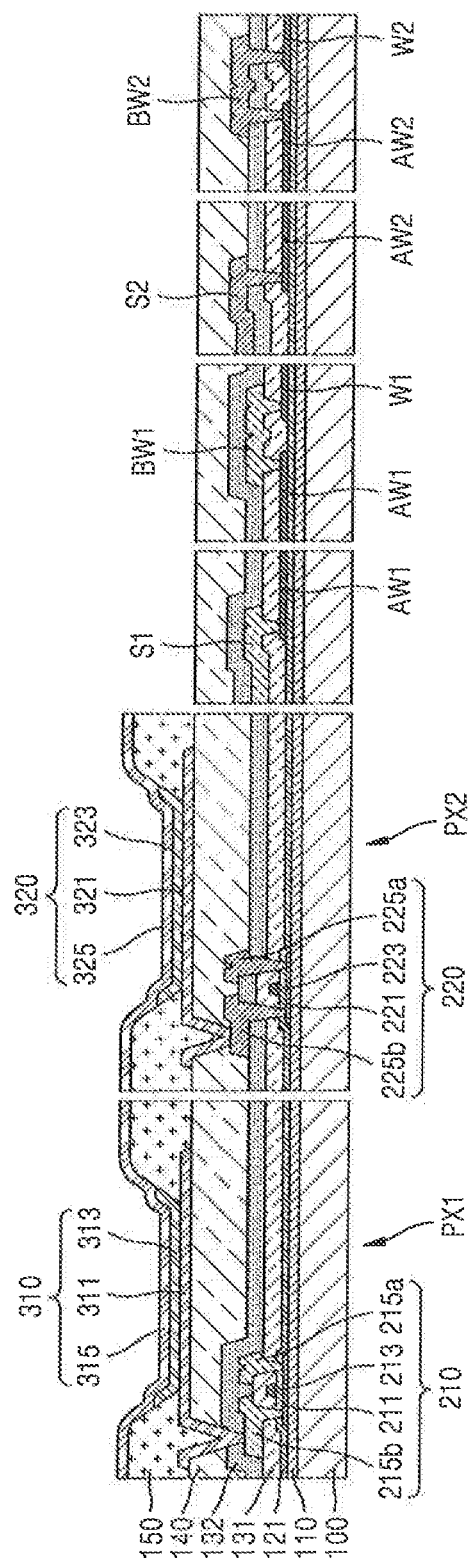
FIG. 14 is a cross-sectional view schematically illustrating portions of a display apparatus according to an exemplary embodiment of the inventive concept.

FIG. 14 is a cross-sectional view schematically illustrating portions of a display apparatus according to an exemplary embodiment of the inventive concept. Different from the display apparatus of FIG. 4, the display apparatus of FIG. 14 further includes a second interlayer insulating film 132 covering the first source electrode 215a and the first drain electrode 215b of the first thin film transistor 210, in addition to the first interlayer insulating film 131, and the second source electrode 225a and the second drain electrode 225b of the second thin film transistor 220 is located on the second interlayer insulating film 132. In other words, the first source electrode 215a and the first drain electrode 215b are located on a different layer from the second source electrode 225a and the second drain electrode 225b.

The second interlayer insulating film 132 extends toward the peripheral area PA and covers the first signal line S1 and the first bridge wiring BW1. However, the second signal line S2 and the second bridge wiring BW2 are located on the second interlayer insulating film 132. Even in this state, the second signal line S2 contacts the second additional wiring AW2 via a contact hole that penetrates through the first interlayer insulating film 131 and the second interlayer insulating film 132, and the second bridge wiring BW2 also contacts the second additional wiring AW2 and the second wiring W2 via contact holes that penetrate through the first interlayer insulating film 131 and the second interlayer insulating film 132.

Figure 15:
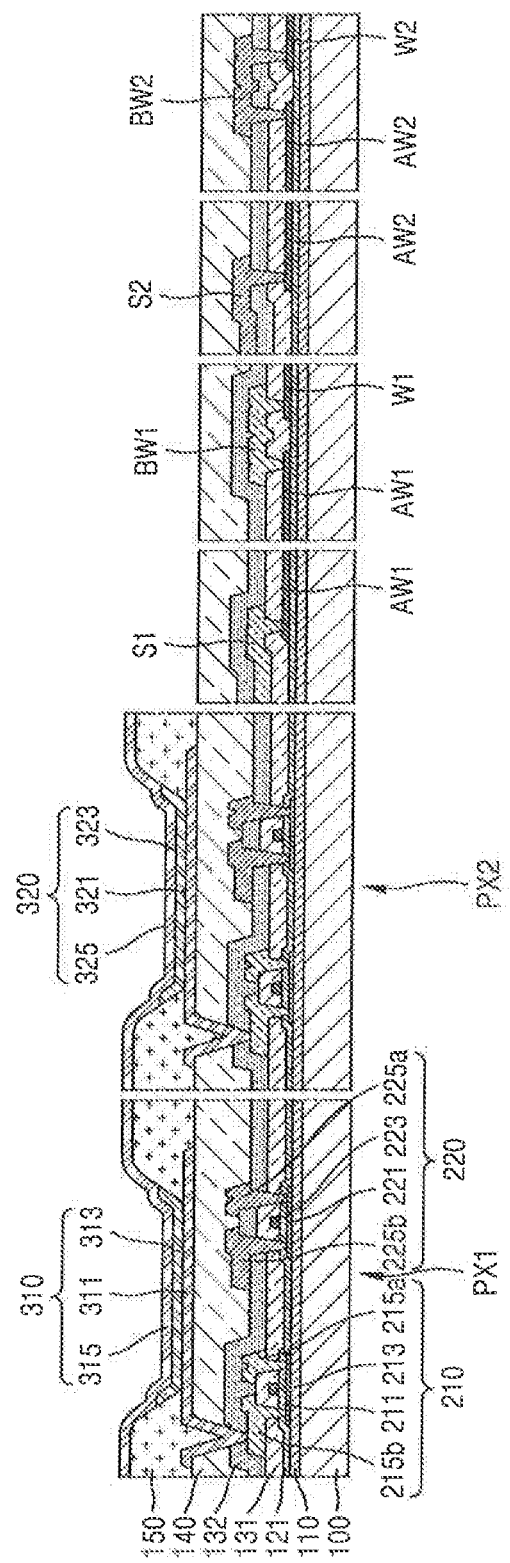
FIG. 15 is a cross-sectional view schematically illustrating portions of a display apparatus according to an exemplary embodiment of the inventive concept.

Although FIG. 14 illustrates that the first thin film transistor 210 is located at the pixel PX1 and that the second thin film transistor 220 is located at the pixel PX2, the present disclosure is not limited thereto. For example, the cross-sectional view of FIG. 15 schematically illustrates portions of a display apparatus according to another embodiment where the second thin film transistor 220 as well as the first thin film transistor 210 belong to the pixel PX1. In other words, in the first thin film transistor 210 and the second thin film transistor 220 which belong to one pixel, that is, the pixel PX1, the first source electrode 215a and the first drain electrode 215b of the first thin film transistor 210 are located on a different layer from the second source electrode 225a and the second drain electrode 225b of the second thin film transistor 220. To this end, the display apparatus according to the present embodiment further includes the second interlayer insulating film 132 covering the first source electrode 215a and the first drain electrode 215b of the first thin film transistor 210, and the second source electrode 225a and the second drain electrode 225b of the second thin film transistor 220 are located on the second interlayer insulating film 132. The pixel PX2 may also include thin film transistors having the same structure as the first thin film transistor 210 and the second thin film transistor 220 which belong to the pixel PX1.

The second interlayer insulating film 132 extends toward the peripheral area PA, and covers the first signal line S1 and the first bridge wiring BW1. However, the second signal line S2 and the second bridge wiring BW2 are located on the second interlayer insulating film 132. Even in this state, the second signal line S2 contacts the second additional wiring AW2 via a contact hole that penetrates through the first interlayer insulating film 131 and the second interlayer insulating film 132, and the second bridge wiring BW2 also contacts the second additional wiring AW2 and the second wiring W2 via contact holes that penetrate through the first interlayer insulating film 131 and the second interlayer insulating film 132.

Figure 16:
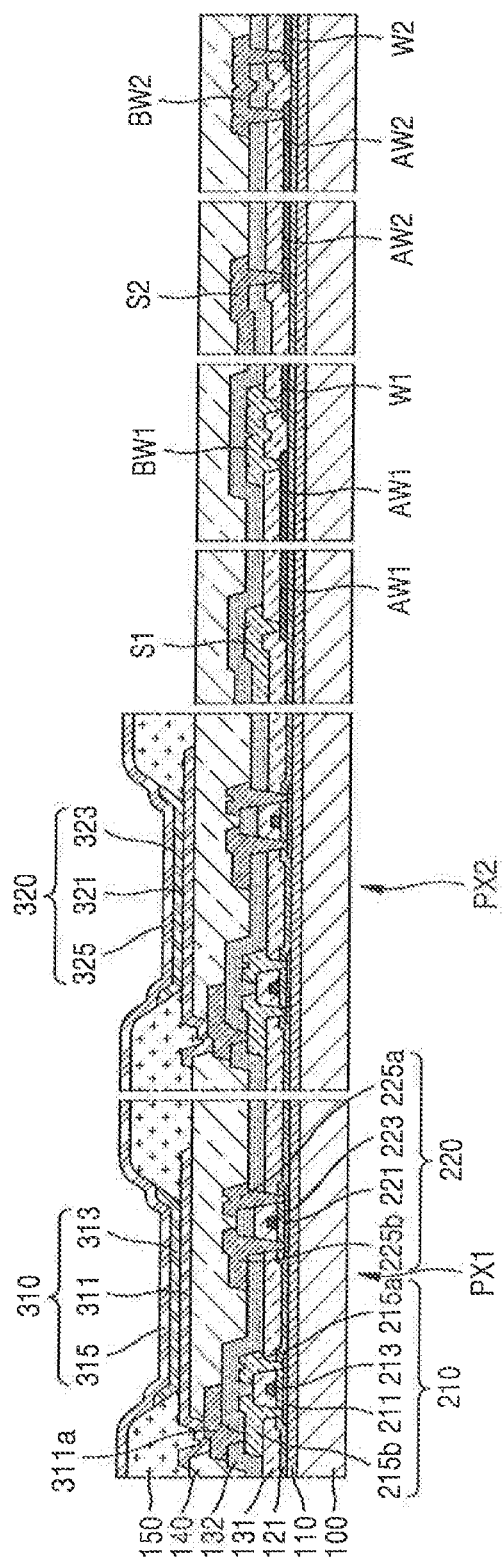
FIG. 16 is a cross-sectional view schematically illustrating portions of a display apparatus according to an exemplary embodiment of the inventive concept.

The cross-sectional view of FIG. 16 schematically illustrates portions of a display apparatus according to another embodiment where any one of the first source electrode 215*a* and the first drain electrode 215*b* of the first thin film transistor 210 is electrically connected to the pixel electrode 311, an intermediate conductive layer 311*a* is interposed between any one of the first source electrode 215*a* and the first drain electrode 215*b* and the pixel electrode 311. In other words, the intermediate conductive layer 311*a* may contact any one of the first source electrode 215*a* and the first drain electrode 215*b*, and the pixel electrode 311 may contact the intermediate conductive layer 311*a*. The intermediate conductive layer 311*a* may include the same material as the second source electrode 225*a* and the second drain electrode 225*b* of the second thin film transistor 220, and may be located on the same layer as the second source electrode 225*a* and the second drain electrode 225*b* of the second thin film transistor 220. In other words, the intermediate conductive layer 311*a* may be simultaneously formed when the second source electrode 225*a* and the second drain electrode 225*b* are formed.

In the display apparatus according to the embodiment described above with reference to FIG. 15, the first signal line S1 and the first bridge wiring BW1 include the same material as the first source electrode 215*a* and the first drain electrode 215*b* of the first thin film transistor 210, and are located on the first interlayer insulating film 131. Further, the second signal line S2 and the second bridge wiring BW2 include the same material as the second source electrode 225*a* and the second drain electrode 225*b* of the second thin film transistor 220, and are located on the second interlayer insulating film 132. However, the present disclosure is not limited thereto.

Figure 17:
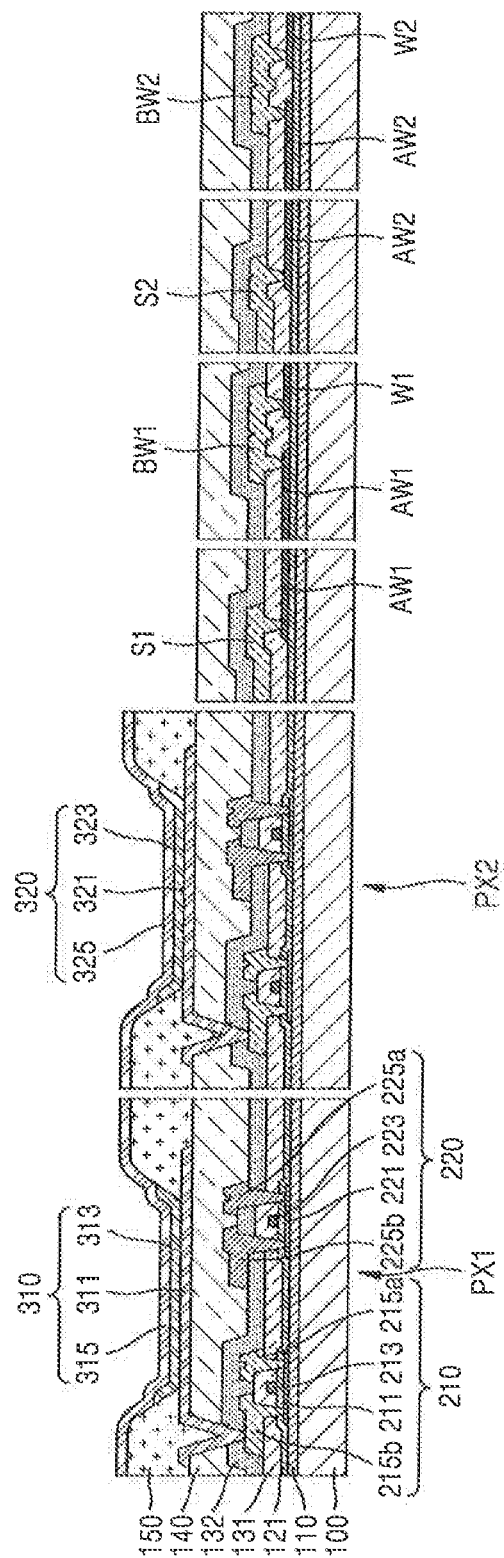
FIG. 17 is a cross-sectional view schematically illustrating portions of a display apparatus according to an exemplary embodiment of the inventive concept.

For example, the cross-sectional view of FIG. 17 schematically illustrates portions of a display apparatus according to another embodiment where the first source electrode 215*a* and the first drain electrode 215*b* of the first thin film transistor 210 are located on a different layer from the second source electrode 225*a* and the second drain electrode 225*b* of the second thin film transistor 220, and the second signal line S2 and the second bridge wiring BW2 are located on the same layer as the first signal line S1 and the first bridge wiring BW1. In other words, the first signal line S1, the first bridge wiring BW1, the second signal line S2, and the second bridge wiring BW2 may be formed of the same material at the same time when the first source electrode 215*a* and the first drain electrode 215*b* of the first thin film transistor 210 are formed.

Figure 18:
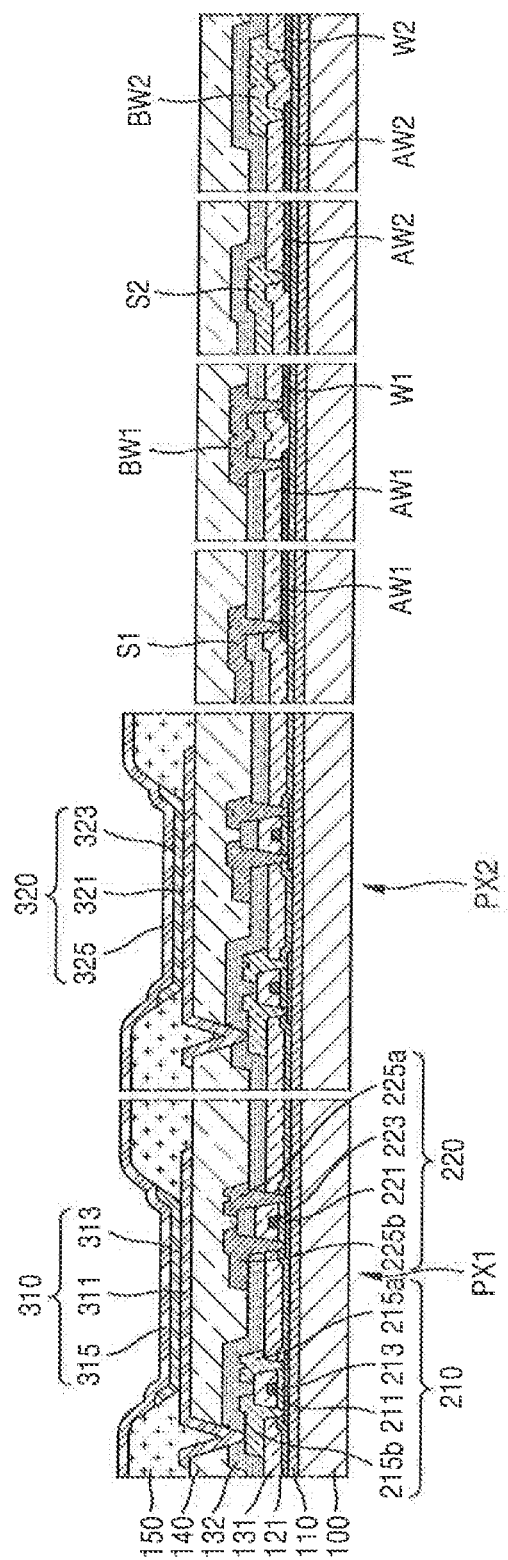
FIG. 18 is a cross-sectional view schematically illustrating portions of a display apparatus according to an exemplary embodiment of the inventive concept.

Unlike the illustration in FIG. 15, in the cross-sectional view of FIG. 18 schematically illustrates portions of a display apparatus where the second interlayer insulating film 132 extends toward the peripheral area PA, and covers the second signal line S2 and the second bridge wiring BW2 located on the first interlayer insulating film 131. The first signal line S1 and the first bridge wiring BW1 may be located on the second interlayer insulating film 132. Even in this state, the first signal line S1 contacts the first additional wiring AW1 via a contact hole that penetrates through the first interlayer insulating film 131 and the second interlayer insulating film 132, and the first bridge wiring BW1 also contacts the first additional wiring AW1 and the first wiring W1 via contact holes that penetrate through the first interlayer insulating film 131 and the second interlayer insulating film 132.

Figure 19:
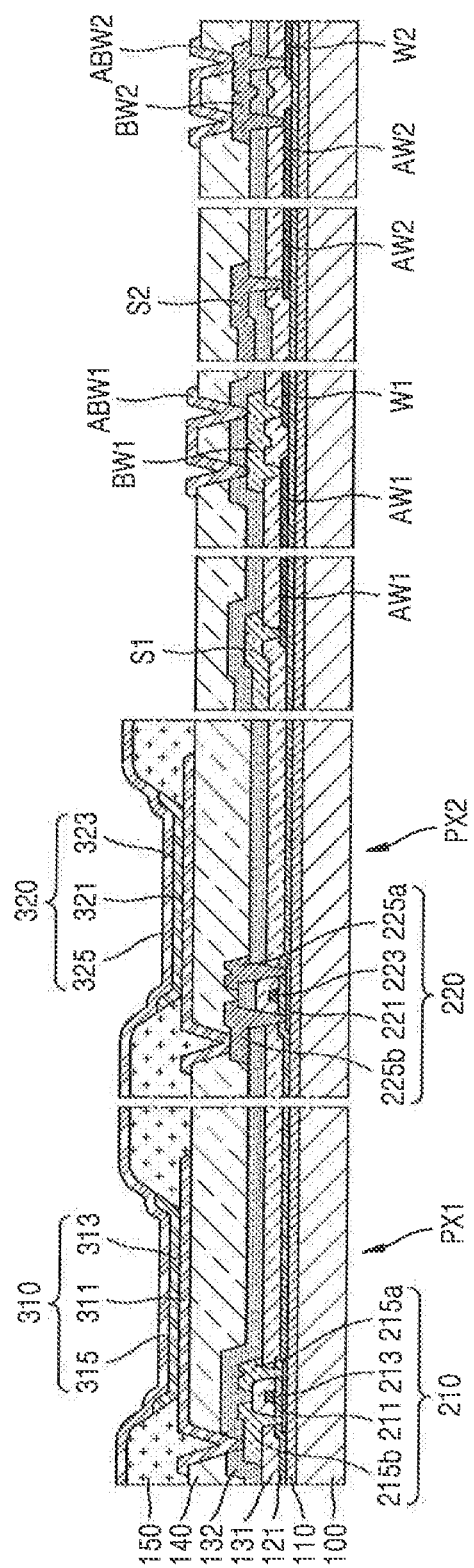
FIG. 19 is a cross-sectional view schematically illustrating portions of a display apparatus according to an exemplary embodiment of the inventive concept.

FIG. 19 is a cross-sectional view schematically illustrating portions of a display apparatus according to an exemplary embodiment of the inventive concept. Different from the display apparatus of FIG. 14, the display apparatus of FIG. 19 further includes the first additional bridge wiring ABW1 and a second additional bridge wiring ABW2. The first additional bridge wiring ABW1 is located over the first bridge wiring BW1, and has both ends connected to the first bridge wiring BW1. The second additional bridge wiring ABW2 is located over the second bridge wiring BW2, and has both ends connected to the second bridge wiring BW2.

In the manufacturing process, the planarization layer 140 covering the first source electrode 215*a*, the first drain electrode 215*b*, the second source electrode 225*a*, the second drain electrode 225*b*, the first signal line S1, the first bridge wiring BW1, the second signal line S2, and the second bridge wiring BW2 is formed, contact holes to connect the pixel electrodes 311 and 321 to the first thin film transistor 210 and the second thin film transistor 220 are formed in the planarization layer 140, and the pixel electrodes 311 and 321 are formed on the planarization layer 140. In this state, when the contact holes are formed, contact holes for exposing the first bridge wiring BW1 and contact holes for exposing the second bridge wiring BW2 are simultaneously formed. After that, when the pixel electrodes 311 and 321 are formed, the first additional bridge wiring ABW1 having both ends connected to the first bridge wiring BW1 via contact holes, and the second additional bridge wiring ABW2 having both ends connected to the second bridge wiring BW2 via contact holes, may be formed of the same material at the same time. In this case, since the first bridge wiring BW1 and the first additional bridge wiring ABW1 are parallelly connected to each other and the second bridge wiring BW2 and the second additional bridge wiring ABW2 are parallelly connected to each other, considering the first bridge wiring BW1 and the first additional bridge wiring ABW1, and the second bridge wiring BW2 and the second additional bridge wiring ABW2, a reduced total resistance may be obtained.

Figure 20:
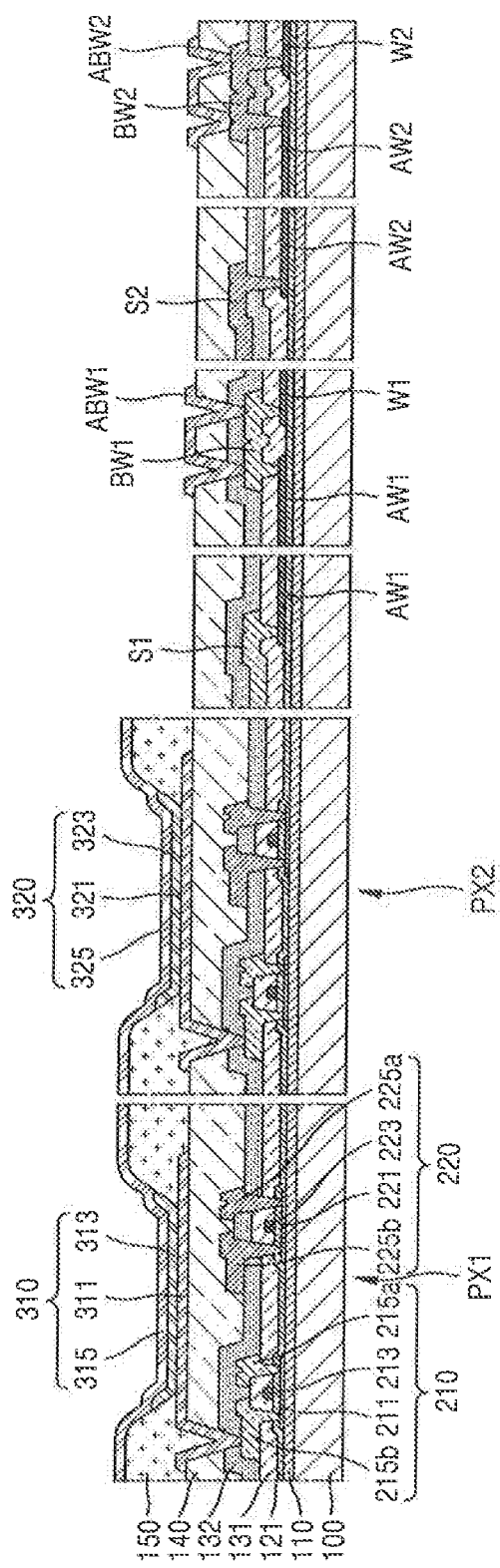
FIG. 20 is a cross-sectional view schematically illustrating portions of a display apparatus according to an exemplary embodiment of the inventive concept.

Although FIG. 19 illustrates that the first thin film transistor 210 belongs to the pixel PX1 and the second thin film transistor 220 belongs to the pixel PX2, the present disclosure is not limited thereto. For example, the cross-sectional view of FIG. 20 schematically illustrates portions of a display apparatus where the second thin film transistor 220 as well as the first thin film transistor 210 belong to the pixel PX1. In other words, in the first thin film transistor 210 and the second thin film transistor 220 which belong to one pixel, that is, the pixel PX1, the first source electrode 215*a* and the first drain electrode 215*b* of the first thin film transistor 210 are located on a different layer from the second source electrode 225*a* and the second drain electrode 225*b* of the second thin film transistor 220. In this case, the display apparatus according to the present embodiment further includes the second interlayer insulating film 132 covering the first source electrode 215*a* and the first drain electrode 215*b* of the first thin film transistor 210, and the second source electrode 225*a* and the second drain electrode 225*b* of the second thin film transistor 220 are located on the second interlayer insulating film 132. The pixel PX2 may also include thin film transistors having the same structure as the first thin film transistor 210 and the second thin film transistor 220 belonging to the pixel PX1.

In this case, the first signal line S1, the first wiring W1, the first additional wiring AW1, the first bridge wiring BW1, the first additional bridge wiring ABW1, the second signal line S2, the second wiring W2, the second additional wiring AW2, the second bridge wiring BW2, and the second additional bridge wiring ABW2 as illustrated in FIG. 19 may be identically applied thereto.

Alternatively, as a modified example of the embodiment as illustrated in FIG. 20, the first bridge wiring BW1 and the second bridge wiring BW2 include the same material as the first source electrode 215a and the first drain electrode 215b and are arranged on the same layer as the first source electrode 215a and the first drain electrode 215b, and the first additional bridge wiring ABW1 and the second additional bridge wiring ABW2 include the same material as the second source electrode 225a and the second drain electrode 225b and are arranged on the same layer as the second source electrode 225a and the second drain electrode 225b.

Although various embodiments are described above, the present disclosure is not limited thereto. In other words, it may be said that any display apparatus having a substrate including the display area DA (see FIGS. 1 to 3), in which the first part P1 (see FIGS. 1 to 3) of the edge has a round shape, the peripheral area PA (FIGS. 1 to 3) outside the display area DA, and the pad area PADA (see FIGS. 1 to 3) inside the peripheral area PA, a first wiring extending from the pad area PADA in the direction toward the first part P1 and having a first discontinuous point where the first wiring is physically discontinuous, and a first bridge wiring that allows the first wiring to be electrically continuous at the first discontinuous point, may belong to the technical scope of the present disclosure.

In this state, the display apparatus according to the present disclosure may further include a second wiring extending from the pad area PADA in the direction toward the first part P1 and having a second discontinuous point where the second wiring is physically discontinuous, and a second bridge wiring that allows the second wiring to be electrically continuous at the second discontinuous point. The second bridge wiring may be located farther from the pad area PADA than the first bridge wiring in the +y direction (see FIG. 3), and the second bridge wiring may be closer to the edge E1 (see FIG. 1) of the substrate than the first bridge wiring.

In addition, in the above description, although the edge of the display area DA is described to have a rectangular or square shape as a whole while partially having a round shape, the present disclosure is not limited thereto. For example, a display apparatus having a portion other than the first part P1 of the edge of the display area DA having a round shape, belongs to the technical scope of the present disclosure. For example, the edge of the display area DA may be entirely circular or oval.

As described above, according to at least one embodiment of the display apparatus, in the manufacturing process, the generation of a defect in pixels of the edge of the display area may be reduced.

While one or more embodiments of the inventive concept have been described with reference to the figures, it will be understood by those of ordinary skill in the art that various changes in form and details may be made therein without departing from the spirit and scope of the inventive concept.

What is claimed is:

1. A display device comprising:
a substrate comprising a display area and a peripheral area located outside the display area, wherein a first part of an edge of the display area has a curved shape and the peripheral area includes a pad area;
a first wiring comprising a first one end located in the pad area and a first other end located in the peripheral area;
a first additional wiring comprising a first additional one end electrically connected to the first other end of the first wiring and a first additional other end located in the peripheral area; and
a first bridge wiring comprising a first end electrically connected to the first other end of the first wiring and a second end electrically connected to the first additional one end of the first additional wiring.

2. The display device of claim 1, wherein the first end of the first bridge wiring is closer to the display area than the second end of the first bridge wiring.

3. The display device of claim 1, wherein the first end of the first bridge wiring is physically connected to the first other end of the first wiring and the second end of the first bridge wiring is physically connected to the first additional one end of the first additional wiring.

4. The display device of claim 1, further comprising a first signal line extending toward an inside of the display area and having one end electrically connected to the first additional other end.

5. The display device of claim 4, wherein the first wiring and the first additional wiring comprise a same material, and the first bridge wiring comprises a same material as the first signal line.

6. The display device of claim 4, wherein the first bridge wiring is arranged on a same layer as the first signal line.

7. The display device of claim 6, wherein the first wiring and the first additional wiring are arranged on a same layer.

8. The display device of claim 6, further comprising a first additional bridge wiring located over the first bridge wiring and having both ends connected to the first bridge wiring.

9. The display device of claim 1, further comprising a thin film transistor located in the display area and comprising a gate electrode, a source electrode, and a drain electrode, the source and drain electrodes being located on an interlayer insulating film covering the gate electrode, wherein the first wiring and the first additional wiring comprise a same material as the gate electrode and are arranged on a same layer as the gate electrode, and the first signal line comprises a same material as the source electrode and the drain electrode and is arranged on a same layer as the source electrode and the drain electrode.

10. The display device of claim 9, wherein the first bridge wiring comprises a same material as the first signal line, and the first bridge wiring is arranged on a same layer as the first signal line.

11. The display device of claim 10, further comprising:
a pixel electrode electrically connected to one of the source electrode and the drain electrode; and
a first additional bridge wiring having both ends connected to the first bridge wiring,
wherein the first additional bridge wiring comprises a same material as the pixel electrode, and the first additional bridge wiring is arranged on a same layer as the pixel electrode.

12. The display device of claim 8, further comprising:
a pixel electrode electrically connected to one of the source electrode and the drain electrode; and
a first additional bridge wiring connecting the first other end of the first wiring and the first additional one end of the first additional wiring, the first additional bridge wiring comprising a same material as the pixel electrode, and the first additional bridge wiring arranged on a same layer as the pixel electrode.

13. The display device of claim 1, wherein the first other end of the first wiring is closer to the display area than the first additional one end of the first additional wiring.

14. The display device of claim 1, wherein the display area comprises a first edge and a second edge facing each other, and a third edge and a fourth edge facing each other and being arranged between the first edge and the second edge, the first part connecting the first edge and the fourth edge, and the pad area is closer to the fourth edge among the first edge to the fourth edge.

15. The display device of claim 12, further comprising:
a second wiring comprising a second one end located in the pad area and a second other end located in the peripheral area, and arranged closer to the first edge than the first wiring;
a second additional wiring comprising a second additional one end electrically connected to the second other end of the second wiring and a second additional other end located in the peripheral area, and arranged closer to the first edge than the first additional wiring; and
a second signal line having one end electrically connected to the second additional other end and extending toward the inside of the display area.

16. The display device of claim 15, wherein a shortest distance from an imaginary straight line including the fourth edge to a second position at which the second other end of the second wiring and the second additional one end of the second additional wiring are connected to each other is greater than a shortest distance from the imaginary straight line to a first position where the first other end of the first wiring and the first additional one end of the first additional wiring are connected to each other.

17. The display device of claim 15, further comprising:
a second bridge wiring connecting the second other end of the second wiring and the second additional one end of the second additional wiring.

18. The display device of claim 17, further comprising:
a first thin film transistor located in the display area and comprising a first gate electrode, a first source electrode, and
a first drain electrode; and
a second thin film transistor located in the display area and comprising a second gate electrode, a second source electrode, and a second drain electrode, wherein the first gate electrode and the second gate electrode are located on different layers, and the first source electrode, the first drain electrode, the second source electrode, and the second drain electrode are located on an interlayer insulating film covering the first gate electrode and the second gate electrode, and wherein the first wiring and the first additional wiring comprise a same material as the first gate electrode and are arranged on a same layer as the first gate electrode, and the second wiring and the second additional wiring comprise a same material as the second gate electrode and are arranged on a same layer as the second gate electrode.

19. The display device of claim 17, further comprising:
a first thin film transistor located in the display area and comprising a first gate electrode, a first source electrode, and a first drain electrode; and
a second thin film transistor located in the display area and comprising a second gate electrode, a second source electrode, and a second drain electrode, wherein the first gate electrode and the second gate electrode are located on different layers, and the first source electrode, the first drain electrode, the second source electrode, and the second drain electrode are located on an interlayer insulating film covering the first gate electrode and the second gate electrode, and wherein the first wiring and the second additional wiring comprise a same material as the first gate electrode and are arranged on a same layer as the first gate electrode, and the second wiring and the first additional wiring comprise a same material as the second gate electrode and are arranged on a same layer as the second gate electrode.

20. The display device of claim 17, further comprising:
a first thin film transistor located in the display area and comprising a first gate electrode, a first source electrode, and a first drain electrode; and
a second thin film transistor located in the display area and comprising a second gate electrode, a second source electrode, and a second drain electrode, wherein the first source electrode and the first drain electrode are located on a different layer from the second source electrode and the second drain electrode, and wherein the first signal line and the first bridge wiring comprise a same material as the first source electrode and the first drain electrode, and are arranged on a same layer as the first source electrode and the first drain electrode, and the second signal line and the second bridge wiring comprise a same material as the second source electrode and the second drain electrode, and are arranged on a same layer as the second source electrode and the second drain electrode.

21. The display device of claim 17, further comprising:
a first thin film transistor located in the display area and comprising a first gate electrode, a first source electrode, and a first drain electrode;
a second thin film transistor located in the display area and comprising a second gate electrode, a second source electrode, and a second drain electrode;
a first additional bridge wiring located over the first bridge wiring and having both ends connected to the first bridge wiring; and
a second additional bridge wiring located over the second bridge wiring and having both ends connected to the second bridge wiring,
wherein the first source electrode and the first drain electrode are located on a different layer from the second source electrode and the second drain electrode, the first bridge wiring and the second bridge wiring comprise a same material as the first source electrode and the first drain electrode, and are arranged on a same layer as the first source electrode and the first drain electrode, and the first additional bridge wiring and the second additional bridge wiring comprise a same material as the second source electrode and the second drain electrode, and are arranged on a same layer as the second source electrode and the second drain electrode.

22. A display device comprising:
a substrate comprising a display area and a peripheral area located outside the display area, wherein a first part of an edge of the display area has a curved shape and the peripheral area includes a pad area;
a first wiring extending in a direction toward the first part from the pad area, and having a first discontinuous point at which the first wiring is physically discontinuous; and
a first bridge wiring allowing the first wiring to be electrically continuous at the first discontinuous point, the first bridge wiring comprising both ends connected to the first wiring at both ends of the first discontinuous point; wherein the extending direction of both ends of the first bridge wiring crosses the extending direction of the first wiring.

23. The display device of claim 22, further comprising:
a second wiring extending in a direction toward the first part from the pad area and having a second discontinuous point at which the second wiring is physically discontinuous; and
a second bridge wiring allowing the second wiring to be electrically continuous at the second discontinuous point; wherein the second bridge wiring is located farther from the pad area than the first bridge wiring, and the second bridge wiring is located closer to an edge of the substrate than the first bridge wiring.

24. A display device comprising:
a substrate comprising a display area and a peripheral area located outside the display area, wherein a first part of an edge of the display area has a curved shape and the peripheral area includes a pad area;
a first wiring extending in a direction toward the first part from the pad area, and having a first discontinuous point at which the first wiring is physically discontinuous;
a second wiring extending in a direction toward the first part from the pad area and having a second discontinuous point at which the second wiring is physically discontinuous;
a first bridge wiring providing an electrical connection to the first wiring at the first discontinuous point; and
a second bridge wiring providing an electrical connection to the first second wiring at the second discontinuous point; wherein the first bridge wiring is located closer to the pad area than the second bridge wiring.

25. A display device comprising:
a substrate comprising a display area and a peripheral area located outside the display area, wherein a first part of an edge of the display area has a curved shape and the peripheral area includes a pad area;
a first wiring comprising a first one end located in the pad area and a first other end located in the peripheral area;
a first additional wiring comprising a first additional one end electrically connected to the first other end of the first wiring and a first additional other end located in the peripheral area; and
at least one first insulating film disposed between a first bridge wiring and the first wiring and between the first bridge wiring and the first additional wiring; wherein the first bridge wiring is connected to the first other end of the first wiring and the one end of the first additional wiring through first contact holes formed in the at least one first insulating film, respectively.

26. The display device of claim 25, wherein the first bridge wiring comprises a first end connected to the first other end of the first wiring through at least one contact hole among the first contact holes, and a second end connected to the first additional one end of the first additional wiring through at least another contact hole among the first contact holes.

27. The display device of claim 26, further comprising:
at least one second insulating film disposed between the first bridge wiring and a first additional bridge wiring; wherein the first additional bridge wiring is connected to the first bridge wiring through second contact holes formed in the at least one second insulating film,
wherein the first additional bridge wiring is located over the first bridge wiring.

28. The display device of claim 27, wherein the first additional bridge wiring comprises a first end connected to the end of the first bridge wiring through at least one contact hole among the second contact holes, and a second end connected to the second end of the first bridge wiring through at least another contact hole among the second contact holes.

* * * * *